(12) United States Patent
Bonilla et al.

(10) Patent No.: US 8,003,520 B2
(45) Date of Patent: Aug. 23, 2011

(54) AIR GAP STRUCTURE HAVING PROTECTIVE METAL SILICIDE PADS ON A METAL FEATURE

(75) Inventors: Griselda Bonilla, Fishkill, NY (US); Daniel C. Edelstein, White Plains, NY (US); Satyanarayana V. Nitta, Poughquag, NY (US); Takeshi Nogami, Schenectady, NY (US); Shom Ponoth, Clifton Park, NY (US); David L. Rath, Stormville, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/972,808

(22) Filed: Dec. 20, 2010

(65) Prior Publication Data

US 2011/0092067 A1    Apr. 21, 2011

Related U.S. Application Data

(62) Division of application No. 11/949,189, filed on Dec. 3, 2007, now Pat. No. 7,884,477.

(51) Int. Cl.
*H01L 21/4763* (2006.01)

(52) U.S. Cl. ........ 438/630; 438/637; 438/648; 438/675; 438/687

(58) Field of Classification Search ................. 438/630, 438/637, 648, 675, 687
See application file for complete search history.

(56) References Cited

U.S. PATENT DOCUMENTS

| | | | |
|---|---|---|---|
| 6,143,641 A * | 11/2000 | Kitch | 438/618 |
| 6,147,009 A | 11/2000 | Grill et al. | |
| 6,252,290 B1 | 6/2001 | Quek et al. | |
| 6,312,793 B1 | 11/2001 | Grill et al. | |
| 6,348,731 B1 | 2/2002 | Ashley et al. | |
| 6,437,443 B1 | 8/2002 | Grill et al. | |
| 6,441,491 B1 | 8/2002 | Grill et al. | |
| 6,479,110 B2 | 11/2002 | Grill et al. | |
| 6,497,963 B1 | 12/2002 | Grill et al. | |
| 6,541,398 B2 | 4/2003 | Grill et al. | |
| 6,577,011 B1 | 6/2003 | Buchwalter et al. | |
| 7,053,462 B2 | 5/2006 | Yang et al. | |
| 2005/0167838 A1 | 8/2005 | Edelstein et al. | |

* cited by examiner

*Primary Examiner* — Phat X Cao
(74) *Attorney, Agent, or Firm* — Scully, Scott, Murphy & Presser, P.C.; Wenjie Li

(57) ABSTRACT

A hard mask is formed on an interconnect structure comprising a low-k material layer and a metal feature embedded therein. A block polymer is applied to the hard mask layer, self-assembled, and patterned to form a polymeric matrix of a polymeric block component and containing cylindrical holes. The hard mask and the low-k material layer therebelow are etched to form cavities. A conductive material is plated on exposed metallic surfaces including portions of top surfaces of the metal feature to form metal pads. Metal silicide pads are formed by exposure of the metal pads to a silicon containing gas. An etch is performed to enlarge and merge the cavities in the low-k material layer. The metal feature is protected from the etch by the metal silicide pads. An interconnect structure having an air gap and free of defects to surfaces of the metal feature is formed.

10 Claims, 23 Drawing Sheets

AIR GAP STRUCTURE HAVING PROTECTIVE METAL SILICIDE PADS ON A METAL FEATURE

RELATED APPLICATION

This application is a divisional of U.S. Ser. No. 11/949,189, filed Dec. 3, 2007, the entire contents of which are incorporated herein by reference.

FIELD OF THE INVENTION

Background of the Invention

The present invention relates to semiconductor structures, and particularly to an interconnect structure having protective metal silicide pads on a metal feature and methods of manufacturing the same.

Advanced semiconductor chips, such as high performance microprocessor, microcontroller and communication chips, require high speed interconnect structures between individual semiconductor devices which are used to perform various functions such as logical operations, storing and retrieving data, providing control signals and the like. With the progress in the semiconductor device technology leading to ultra large scale integration, the overall speed of operation of the advanced semiconductor chips is approaching a limit due to signal propagation delay in interconnection wires, which are employed as the high speed interconnect structures, between the individual semiconductor devices on the same advanced semiconductor chip.

The signal propagation delay in an interconnect structure is dependent on an RC product of the interconnect structure, where R denotes the resistance of the interconnect wires and C denotes the interconnect capacitance, or the overall capacitance of the interconnect structure in which the interconnect wires are embedded. Use of copper instead of aluminum as the interconnect wiring material has allowed reduction of the resistance contribution to the RC product. Current focus in the microelectronics industry is on reducing the interconnect capacitance by employing low dielectric constant (low k) dielectric materials in the interconnect structure of the advanced semiconductor chips, which typically contain a multilayered interconnect structure.

Formation of an air gap within a dielectric layer has been proposed for reduction of an effective dielectric constant of the dielectric material layer in a back-end-of-line interconnect structure. Of particular relevance to the present invention is an air gap structure disclosed in U.S. Patent Application Publication No. 2005/0167838 to Edelstein et al., the entire contents of which are incorporated herein by reference. In this prior art, a self-assembling diblock copolymer resist is patterned over an interconnect structure and cavities of a sublithographic diameter are formed in a low dielectric constant (low-k) dielectric material layer. An isotropic etch is subsequently performed to merge multiple cavities of the sublithographic diameter to form a merged cavity in the dielectric material layer. Since the dielectric constant of air is substantially 1.0, the effective dielectric constant of the combination of the remaining dielectric layer and the merged cavity is less than the dielectric constant of the dielectric layer alone.

An inevitable consequence of this prior art method is generation of etch damage to exposed top surfaces of a metal line during the isotropic etch. Damages to the exposed top surfaces of the metal line by a reactive ion etch or a wet etch employing an etchant such as dilute hydrofluoric acid during the enlarging and merging of the cavities of a sublithographic diameter adversely impacts reliability characteristics of the interconnect structure.

When electrical current flows in the metal line, the metal ions are subjected to an electrostatic force due to the charge of the metal ion and the electric field to which the metal ion is exposed to. Further, as electrons scatter off the lattice during conduction of electrical current, the electrons transfer momentum to the metal ions in the lattice of the conductor material. The direction of the electrostatic force is in the direction of the electric field, i.e., in the direction of the current, and the direction of the force due to the momentum transfer of the electrons is in the direction of the flow of the electrons, i.e., in the opposite direction of the current. However, the force due to the momentum transfer of the electrons is in general greater than the electrostatic force. Thus, metal ions are subjected to a net force in the opposite direction of the current, or in the direction of the flow of the electrons.

High defect density, i.e., smaller grain size of the metal, or high temperature typically increases electron scattering, and consequently, the amount of momentum transfer from the electrons to the conductor material. Such momentum transfer, if performed sufficiently cumulatively, may cause the metal ions to dislodge from the lattice and move physically. The mass transport caused by the electrical current, or the movement of the conductive material due to electrical current, is termed electromigration in the art. Electromigration may cause formation of a void in a metal line and/or in a metal via, and form an electric open in the metal line and/or in the metal via.

Thus, presence of physical defects, as is generated in the prior art interconnect structure of Edelstein et al., thus increases electron scattering during conduction of current, and degrades electromigration resistance of the metal line. Reliability of the prior art interconnect structure is undermined since formation of voids through electromigration is accelerated due to the presence of the defects formed on surfaces of a metal line during the merging of the sublithographic cavities.

In view of the above, there exists a need for an interconnect structure having an air gap in a low-k material layer without generating structural defects on surfaces of a metal line and methods of manufacturing the same.

SUMMARY OF THE INVENTION

The present invention addresses the needs described above by providing an interconnect structure having a cavity in a low-k dielectric layer in which a metal feature adjoined to the cavity is protected by a metal silicide pad during an etch employed for formation of the cavity.

In the present invention, a hard mask is formed on an interconnect structure comprising a low-k material layer and a metal line embedded therein. A block polymer comprising at least two immiscible polymeric block components is applied to the hard mask layer, self-assembled, and patterned to form a polymeric matrix comprising one of the polymeric block components and containing cylindrical holes. The hard mask and the low-k material layer therebelow are etched to form cavities of a sublithographic diameter. A conductive material is plated on exposed metallic surfaces including portions of top surfaces of the metal line to form metal pads. Upper portion of the metal pads are converted to metal silicide pad by exposure to a silicon containing gas. An etch is performed to enlarge and merge the cavities in the low-k material layer. The metal line is protected from the etch by the metal silicide pads. An interconnect structure having an air gap and free of defects to surfaces of the metal line, and consequently having a high electromigration resistance, is formed.

According to an aspect of the present invention, an interconnect structure is provided, which comprises:

a metal feature located on a low dielectric constant (low-k) material layer having a dielectric constant less than 2.8;

a cavity embedded in the low dielectric constant material layer; and a plurality of metal silicide pads on the metal feature.

In one embodiment, the interconnect structure further comprises a plurality of metal pads, wherein each of the plurality of metal pads vertically abuts the metal feature and one of the plurality of metal silicide pads.

In another embodiment, the plurality of metal silicide pads and the plurality of metal pads comprise a same metal.

In even another embodiment, the metal feature comprises copper and the same metal is an elemental metal or a metallic alloy that is more cathodic than copper in Galvanic series. The same metal may comprise one of Pt, Ti, Ta, Ni, and CoWP. In one case, the same metal is CoWP.

In yet another embodiment, a metal pad of the plurality of metal pads and a metal silicide pad of the plurality of metal silicide pads vertically abut each other and constitute a conductive material stack, wherein the conductive material stack has a substantially constant cross-sectional area between a top surface thereof and a bottom surface thereof.

In still another embodiment, the cross-sectional area of the conductive material stack is substantially a circle.

In still yet another embodiment, a diameter of the circle is a sublithographic dimension. The diameter may be from about 5 nm to about 35 nm.

In a further embodiment, the interconnect structure further comprises a plurality of conductive material stacks, wherein each of the plurality of metal stacks comprises a metal pad vertically abutting the metal feature and a metal silicide pad of the plurality of metal silicide pads that vertically abut each other.

In an even further embodiment, the plurality of conductive material stacks is arranged on the metal feature in a honeycomb pattern.

In a yet further embodiment, each of the plurality of metal silicide pads has a thickness from about 1 nm to about 5 nm.

In a still further embodiment, the interconnect structure further comprises a hard mask layer comprising silicon, carbon, and nitrogen and vertically abutting the metal feature, wherein the plurality of metal silicide pads is located within holes in the hard mask layer.

In a still yet further embodiment, the interconnect structure further comprises a plurality of conductive material stacks, wherein each of the plurality of metal stacks comprises a metal pad and a metal silicide pad of the plurality of metal silicide pads that vertically abut each other, wherein a thickness of each of the plurality of conductive material stacks is less than a thickness of the hard mask layer.

In another further embodiment, the thickness of the hard mask layer is from about 10 nm to about 50 nm, and wherein the thickness of each of the plurality of the conductive material stacks is from about 3 nm to about 40 nm.

In even another further embodiment, the interconnect structure further comprises a metallic liner laterally abutting and surrounding the metal feature and laterally abutting the cavity.

In yet another further embodiment, the interconnect structure further comprises:

at least one metal portion laterally abutting the metallic liner; and at least one metal silicide portion laterally abutting one of the at least one metal portion and comprising the same material as the plurality of metal silicide pads, wherein the cavity directly contacts the at least one metal silicide portion.

In still another further embodiment, the interconnect structure further comprises:

a hard mask layer comprising silicon, carbon, and nitrogen and vertically abutting the metal feature; and another low-k material layer having a dielectric constant less than 2.8 and vertically abutting the hard mask layer, wherein the cavity is encapsulated by the low-k material layer, the metallic liner, the at least one metal silicide portion, the hard mask layer, and the another low-k material layer.

In still yet another further embodiment, the low-k dielectric material layer comprises at least one of an organosilicate glass (OSG) and a spin-on low-k dielectric material, wherein the OSG contains a matrix of a hydrogenated oxidized silicon carbon material (SiCOH) comprising atoms of Si, C, O and H in a covalently bonded tri-dimensional network, and wherein the spin-on low-k dielectric material comprises a thermosetting polyarylene ether.

According to another aspect of the present invention, a method of forming an interconnect structure is provided, which comprises:

forming a metal feature within a low dielectric constant (low-k) material layer having a dielectric constant less than 2.8;

forming a hard mask layer comprising a dielectric material on the metal feature and the low-k material layer;

forming a plurality of holes in the hard mask layer to expose portions of the metal feature and portions of the low-k material layer;

selectively forming a plurality of conductive material stacks directly on the metal feature, while not forming a conductive material stack on the low-k material layer; and forming a cavity having a lithographic lateral dimension in the low-k material layer by an etch, while the plurality of conductive material stacks protects the metal feature from the etch.

In one embodiment, the metal feature and the low-k material layer have substantially coplanar top surfaces, and wherein the hard mask layer abuts the substantially coplanar top surfaces.

In another embodiment, the cavity includes at least two holes of the plurality of holes.

In even another embodiment, each of the plurality of conductive material stacks comprises a metal pad and a metal silicide pad, wherein the metal pad vertically abuts the metal feature and the metal silicide pad.

In yet another embodiment, the method further comprises plating an elemental metal or a metallic alloy on the metal feature to form a plurality of the metal pads. The elemental metal or the metallic alloy may comprise one of Pt, Ti, Ta, Ni, and CoWP.

In still yet another embodiment, the method further comprises exposing the metal pad to a silicon containing gas at a temperature from about 200° C. to about 600° C., wherein the silicon containing gas is one of $SiH_4$, $SiH_2Cl_2$, $SiHCl_3$, $SiCl_4$, $Si_2H_6$, chlorinated derivatives of $Si_2H_6$, and a mixture thereof.

In a further embodiment, the method further comprises exposing the metal pad to a plasma containing a silicon containing gas, wherein the silicon containing gas is one of $SiH_4$, $SiH_2Cl_2$, $SiHCl_3$, $SiCl_4$, $Si_2H_6$, chlorinated derivatives of $Si_2H_6$, and a mixture thereof.

In an even further embodiment, the method further comprises converting a portion of each of the plurality of the metal pads to one of a plurality of the metal silicide pads by incorporating silicon into the portion.

In a yet further embodiment, a thickness of each of the plurality of the conductive material stacks is from about 3 nm to about 40 nm and a thickness of each of the plurality of metal silicide pads has a thickness from about 1 nm to about 5 nm.

In an even further embodiment, the method further comprises forming a metallic liner in a line trench in the low-k material layer prior to forming the metal feature, wherein the metallic liner abuts the low-k material layer prior to formation of the cavity, and wherein the metallic liner abuts the cavity after formation of the cavity.

In a yet further embodiment, the method further comprises:
forming at least one metal portion laterally abutting the metallic liner and comprising the same material as a plurality of the metal pad; and
forming at least one metal silicide portion laterally abutting one of the at least one metal portion and comprising the same material as a plurality of the metal silicide pad, wherein the cavity directly contacts the at least one metal silicide portion.

In a still further embodiment, the method further comprises forming another low-k material layer having a dielectric constant less than 2.8 and vertically abutting the hard mask layer, wherein the cavity is encapsulated by the low-k material layer, the metallic liner, the at least one metal silicide portion, the hard mask layer, and the another low-k material layer.

In a still yet further embodiment, the method further comprises:
forming a via hole in the low-k material layer; and
forming the metallic liner in the via hole, wherein the via hole is located directly beneath the line trench.

In another further embodiment, the method further comprises:
forming a polymeric matrix comprising a first polymeric block component and containing cylindrical holes having a sublithographic diameter on the hard mask layer; and
forming a plurality of cylindrical holes having the sublithographic diameter in the hard mask layer by etching the hard mask layer.

In even further another embodiment, the method further comprises:
applying a block copolymer on the hard mask layer, wherein the block copolymer comprises at least the first polymeric block component and a second polymeric block component that are immiscible with each other;
annealing the block copolymer to form a plurality of cylindrical blocks comprising the second polymeric block component and having the sublithographic diameter and embedded in the polymeric matrix; and
selectively removing the second polymeric block component relative to the polymeric matrix.

In yet further another embodiment, the sublithographic diameter is from about 5 nm to about 35 nm.

The plurality of cylindrical holes may be arranged on the metal feature in a honeycomb pattern. The hard mask layer may comprises silicon carbide nitride.

DETAILED DESCRIPTION OF THE INVENTION

Figure 1A:
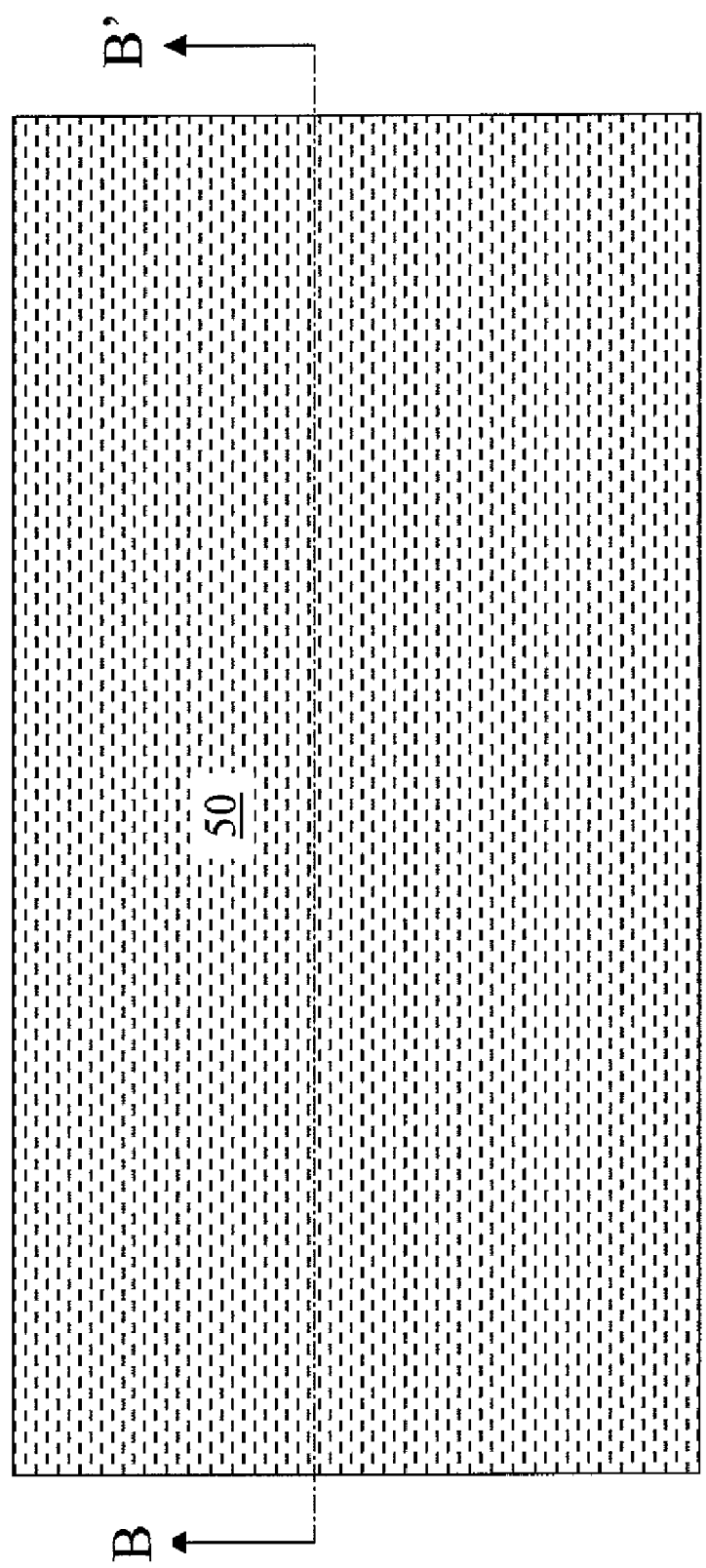
FIGS. 1A-9B are sequential views of an exemplary structure according to the present invention. Figures with the same numeric label correspond to the same stage of manufacturing; figures with the suffix "A" are top-down views; figures with the suffix "B" are vertical cross-sectional views along the plane B-B' of the corresponding figure with the same numeric label and the suffix "A.
Figure 1B:
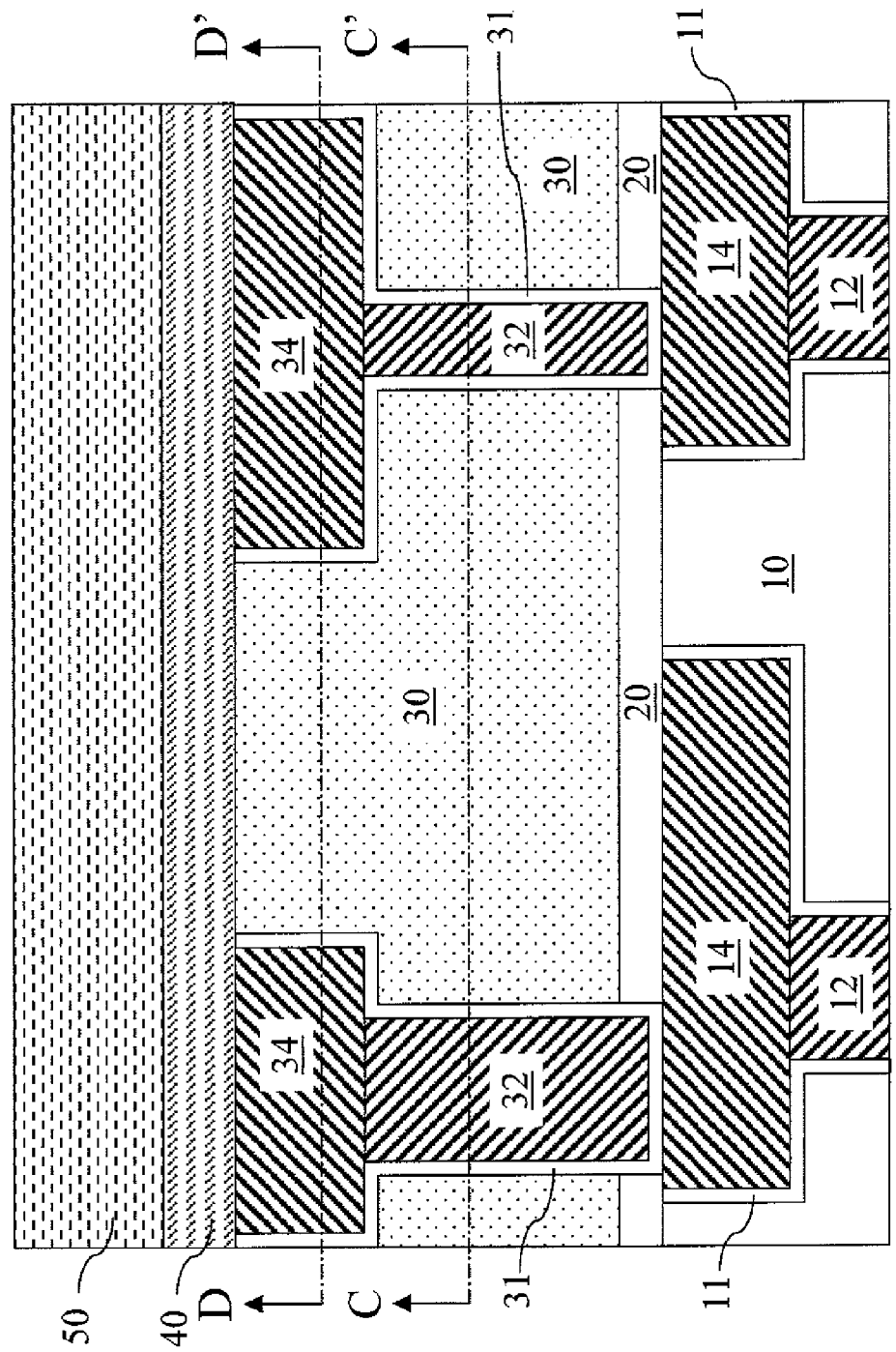
" FIGS. 1C, 7C, and 8C are horizontal cross-sectional views along the plane C-C' of FIGS. 1B, 87B, and 8B, respectively.
FIGS. 1D and 7D are horizontal cross-sectional views along the plane D-D' of FIGS. 1B and 7B, respectively.
Figure 1C:
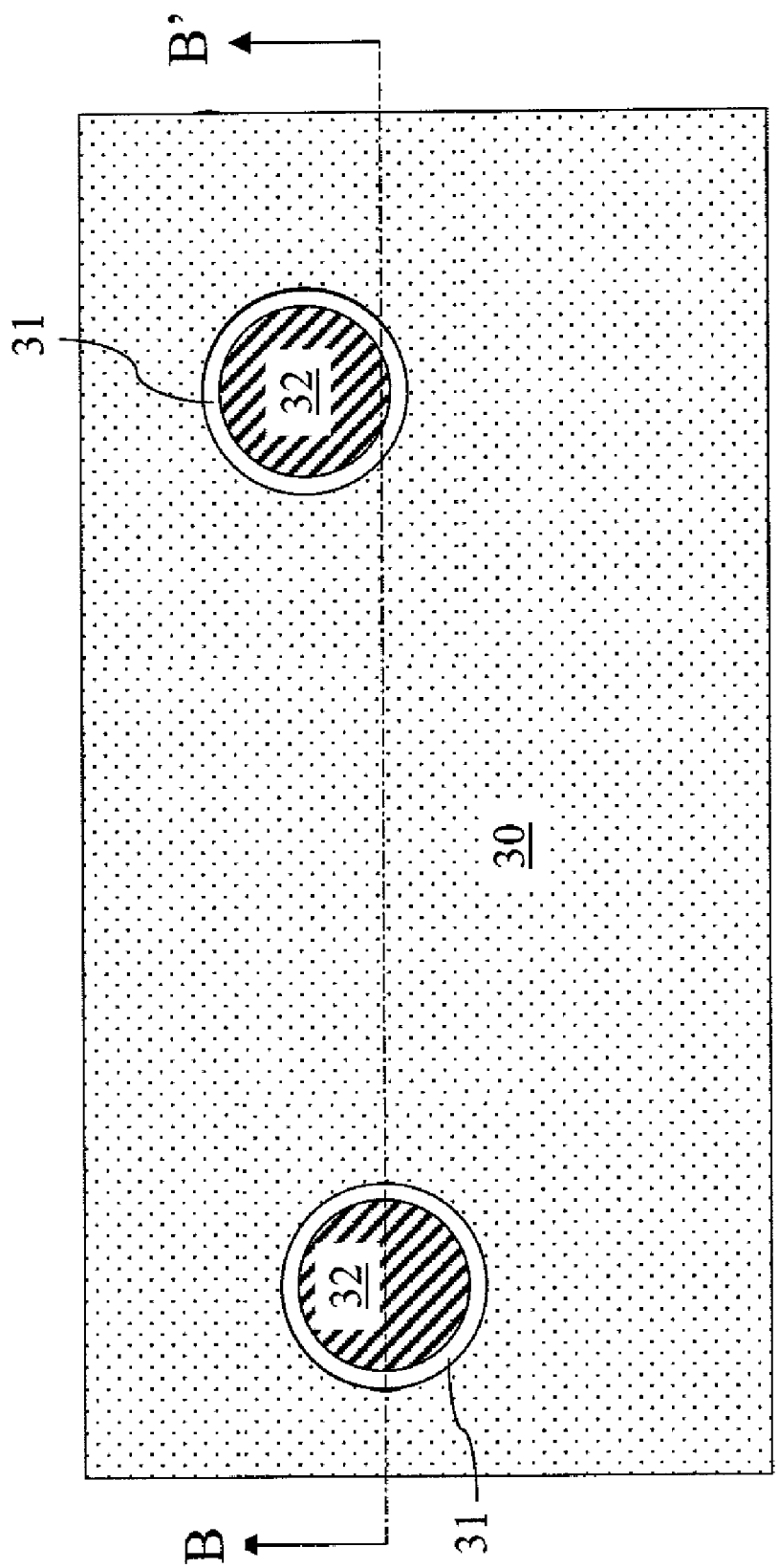
Figure 1D:
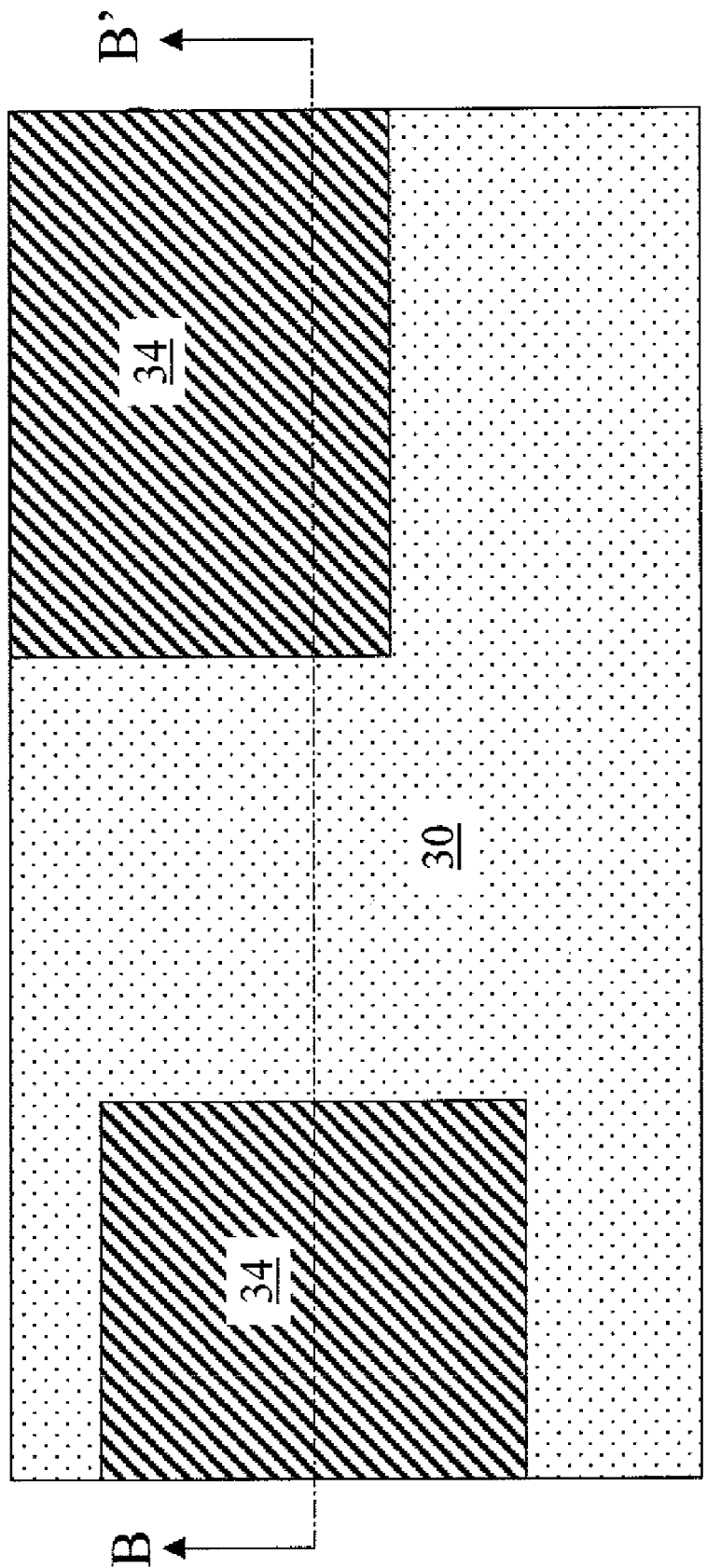

As stated above, the present invention relates to an interconnect structure having protective metal silicide pads on a metal feature and methods of manufacturing the same, which are now described in detail with accompanying figures. It is noted that like and corresponding elements mentioned herein and illustrated in the drawings are referred to by like reference numerals.

Referring to FIGS. 1A-1D, an exemplary interconnect structure according to the present invention is shown, which comprises a metal feature, which is at least one metal line 34. The exemplary interconnect structure further comprises at least one metal via 32, and at least one metallic liner 31 that are embedded in a low dielectric constant (low-k) material layer 30 that comprise a low-k dielectric material having a dielectric constant less than 2.8. The exemplary interconnect structure further comprises at least one underlying metal line 14, at least one underlying metal via 12, and at least one underlying metallic liner 11 that are embedded in an underlying dielectric material layer 10, which may comprise another low-k material or a conventional silicon oxide based dielectric material. A dielectric cap layer 20 is located between the underlying dielectric material layer 10 and the low-k material layer 30.

The low-k material layer 30 comprises a low-k material having a dielectric constant less than 2.8, and preferably less than 2.5. The low-k dielectric material may be an organosilicate glass (OSG) that contain a matrix of a hydrogenated oxidized silicon carbon material (SiCOH) comprising atoms of Si, C, O and H in a covalently bonded tri-dimensional network. Material composition and method of forming the organosilicate glass are disclosed in co-assigned U.S. Pat. Nos. 6,147,009; 6,312,793; 6,441,491; 6,437,443; 6,541,398; 6,479,110, and 6,497,963, the contents of which are incorporated herein by reference.

Alternately, the low-k material layer 30 may be a spin-on low-k dielectric material. The dielectric constant k of the spin-on low-k dielectric material is about 2.8 or less, preferably less than about 2.5. The spin-on low-k dielectric material can be porous or nonporous. An example of the spin-on low-k dielectric material is a thermosetting polyarylene ether, which is also commonly referred to as "Silicon Low-K", or "SiLK™." The term "polyarylene" is used herein to denote aryl moieties or inertly substituted aryl moieties which are linked together by bonds, fused rings, or inert linking groups such as oxygen, sulfur, sulfone, sulfoxide, carbonyl, etc.

The underlying dielectric material layer 10 may comprise a low-k material such as an organosilicate glass or a spin-on low-k dielectric material, which may comprise the same material as, or a different material from, the low-k material layer 30. Alternately, the underlying dielectric material layer 10 may comprise a silicon oxide dielectric material such as an undoped silicate glass (USG), borosilicate glass (BSG), phosphosilicate glass (PSG), fluorosilicate glass (FSG), borophosphosilicate glass (BPSG), or a combination thereof.

The at least one metal line 34 and the at least one underlying metal line 14 comprise a conductive metal such as W, Al, or Cu. Preferably, the conductive metal is copper (Cu). The at least one metal via 32 and the at least one underlying metal line 32 comprise a conductive metal. The at least one metal via 32 and the at least one underlying metal line 32 comprise the same metal as the at least one metal line 34 and the at least one underlying metal line 14.

The at least one metallic liner 31 and the at least one underlying metallic liner 11 comprises one of Ti, TiN, Ta, TaN, WN, and CoWP. The at least one metallic liner 31 abuts the at least one metal line 34 or the at least one metal via 32 on one side and the low-k material layer 30 on the other side. Likewise, the at least one underlying metallic liner 11 abuts the at least one underlying metal line 14 or the at least underlying one metal via 12 on one side and the underlying low-k material layer 10 on the other side. The at least one metallic liner 31 and the at least one underlying metallic liner 11 blocks diffusion of mobile ions or impurities across the at least one metallic liner 31 or the at least one underlying metallic liner 11 and the low-k material layer 30 or the underlying low-k material layer 10. Further, the at least one metallic liner 31 and the at least one underlying metallic liner 11 promotes adhesion of the at least one metal line 34 or the at least one underlying metal line 14.

The dielectric cap layer 20 may comprise silicon carbide, silicon carbide nitride, silicon nitride, silicon oxynitride, or a dielectric material based on hydrogenated oxidized silicon carbon material (SiCOH). The dielectric cap layer 20 may be formed by a chemical vapor deposition, e.g., plasma enhanced chemical vapor deposition (PECVD) or high density plasma chemical vapor deposition (HDPCVD). In case the dielectric cap layer 20 comprises silicon nitride, an ultraviolet radiation cure step may be performed to density the silicon nitride.

Preferably, top surfaces of the at least one metal line 34, the low-k material layer 30, and the at least one metallic liner 31 are substantially coplanar. A hard mask layer 40 is formed on the top surfaces of the at least one metal line 34, the low-k material layer 30, and the at least one metallic liner 31 by chemical vapor deposition (CVD). The hard mask layer 40 may comprise silicon carbide, silicon carbide nitride, silicon nitride, silicon oxynitride, or a dielectric material based on hydrogenated oxidized silicon carbon material (SiCOH). Preferably, the hard mask layer 40 comprises silicon carbide nitride (SiCN). Preferably, the silicon carbide nitride has from about 30% to 60% of carbon and from about 5% to about 20% of nitrogen in atomic concentration, although carbon concentrations and nitrogen concentrations outside the specified ranges are also explicitly contemplated herein. The thickness of the hard mask layer 40 may be from about 10 nm to about 40 nm, although lesser and greater thicknesses are also explicitly contemplated herein.

A block copolymer layer 50 comprising self-assembling block copolymers that are capable of self-organizing into nanometer-scale patterns are applied over the first exemplary structure including the recessed area. Under suitable conditions, the two or more immiscible polymeric block components separate into two or more different phases on a nanometer scale and thereby form ordered patterns of isolated nano-sized structural units. Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 5 to 35 nm, which are sublithographic (i.e., below the resolutions of the lithographic tools).

Exemplary materials for the block copolymer layer 50 are described in commonly-assigned, copending U.S. patent application Ser. Nos. 11/424,963, filed on Jun. 19, 2006, the contents of which are incorporated herein by reference. Specific examples of self-assembling block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). The self-assembling block copolymers are first dissolved in a suitable solvent system to form a block copolymer solution, which is then applied onto the surface of the first exemplary structure to form a block copolymer layer 50. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone.

For example, the block copolymer may comprise the first and second polymeric block components, respectively, at a weight ratio of from about 80:20 to about 60:40. The block copolymer may comprise PS-b-PMMA having a PS:PMMA weight ratio ranging from about 80:20 to about 60:40.

Figure 2A:
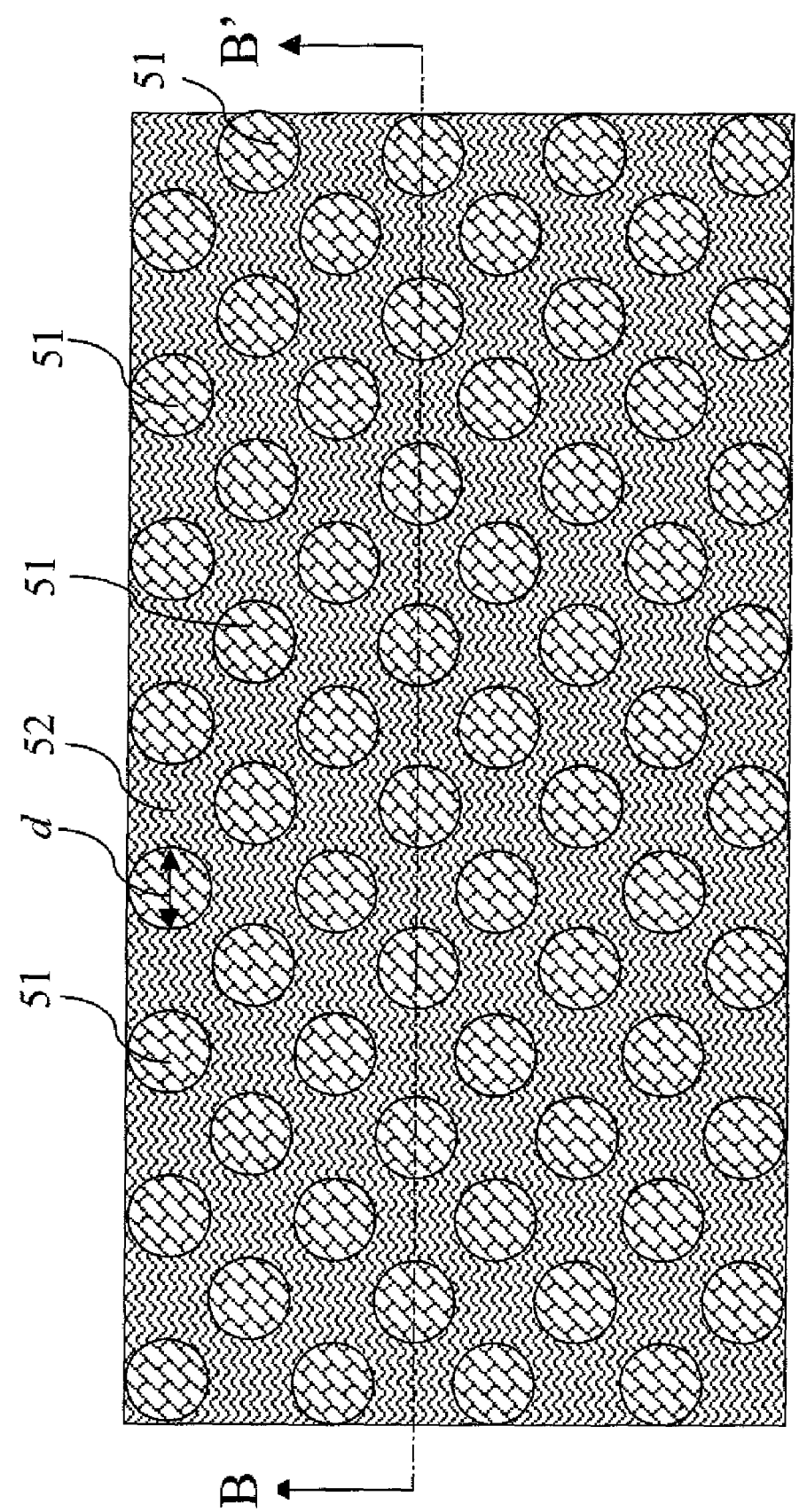
Figure 2B:
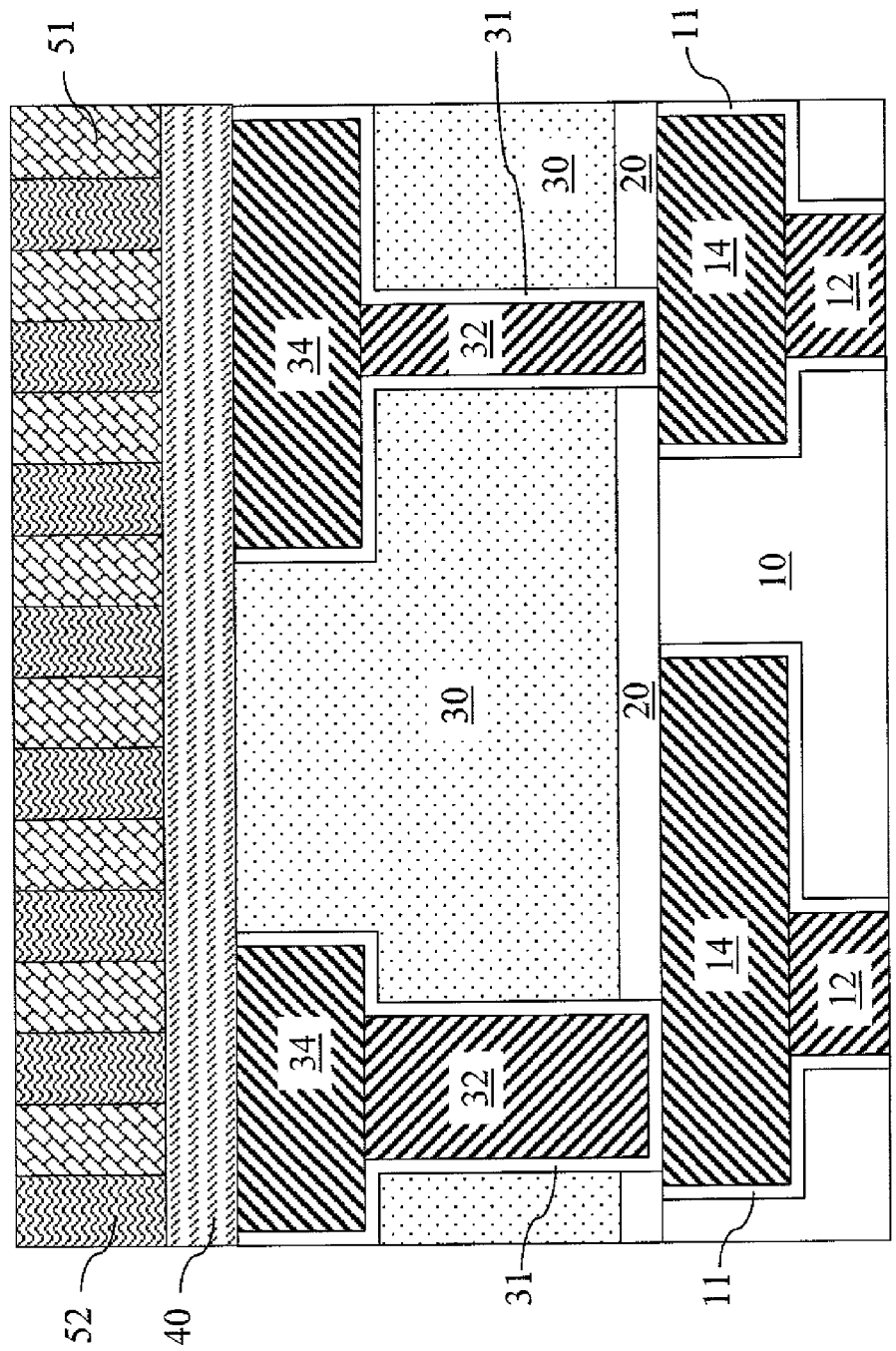

Referring to FIGS. 2A and 2B, the exemplary interconnect structure is annealed by ultraviolet treatment or by thermal annealing at an elevated temperature to form a plurality of cylindrical blocks 51 comprising the second polymeric block component, having a first sublithographic diameter d1 and embedded in a polymeric matrix 52 that comprises the first polymeric block component. The first sublithographic diameter d1 may be from about 5 nm to about 35 nm. Each of the plurality of cylindrical blocks 51 has a substantially horizontal top surface coplanar with a top surface of the polymeric matrix 52 and a substantially horizontal bottom surface coplanar with a top surface of the hard mask layer 40.

Exemplary processes of annealing the self-assembling block copolymers in the block copolymer layer 50 to form two sets of polymer blocks are described in Nealey et al., "Self-assembling resists for nanolithography," IEDM Technical Digest, December, 2005, Digital Object Identifier 10.1109/IEDM.2005.1609349, the contents of which are incorporated herein by reference. Further, methods of annealing described in the '963 Application may be employed. The anneal may be performed, for example, at a temperature from about 200° C. to about 300° C. for a duration from less than about 1 hour to about 100 hours.

Figure 3A:
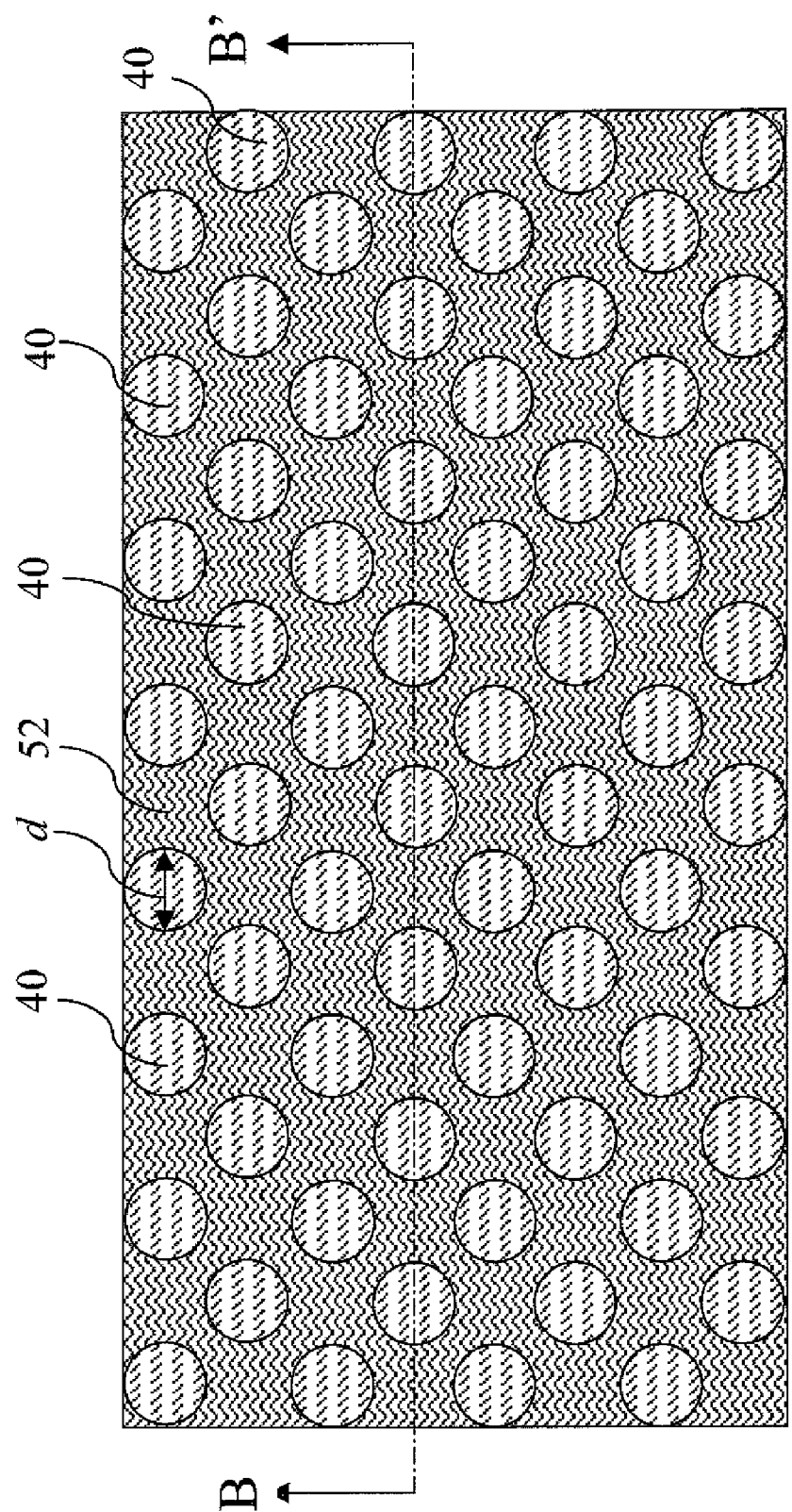
Figure 3B:
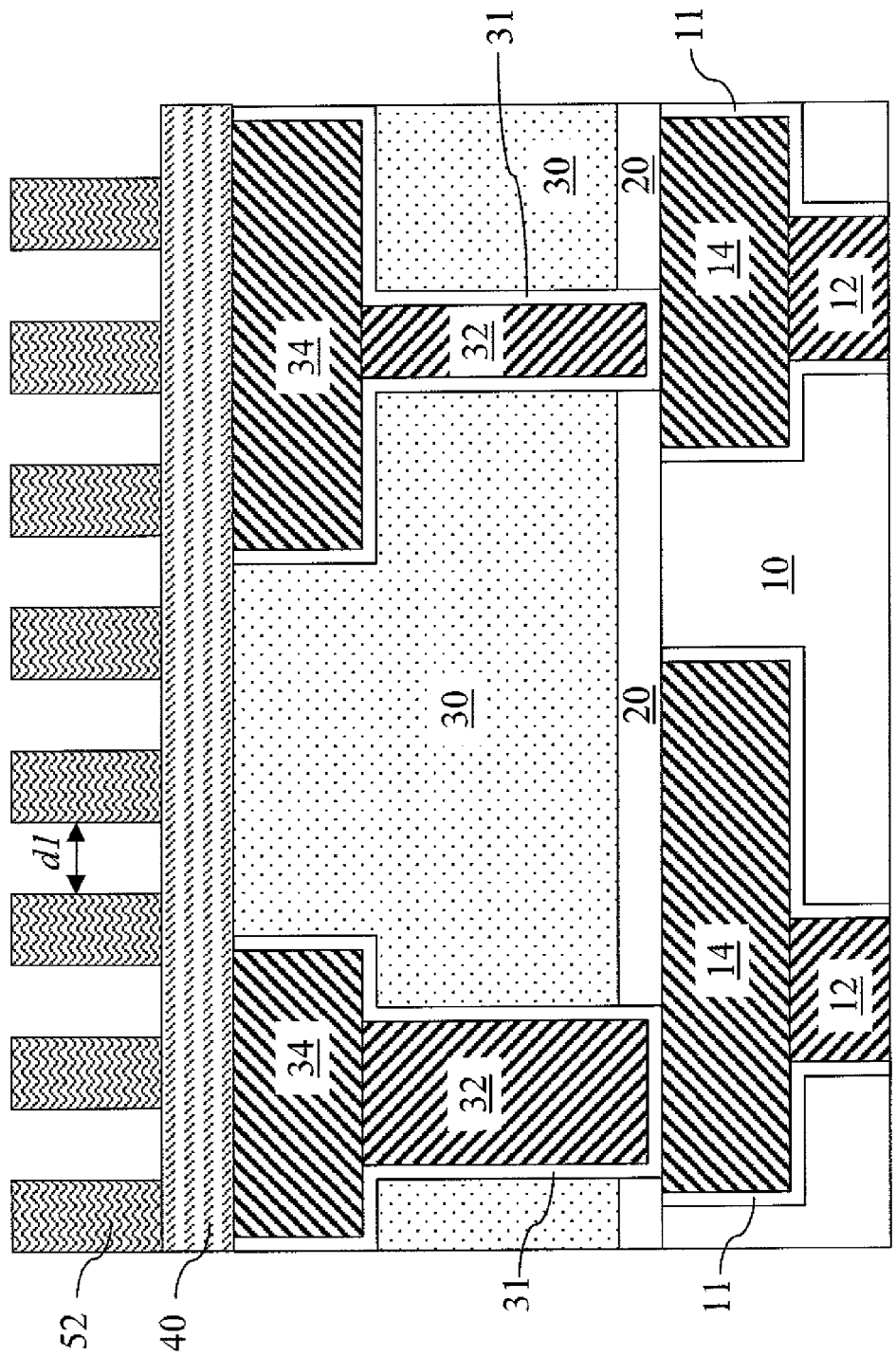

Referring to FIGS. 3A and 3B, the plurality of cylindrical blocks comprising the second polymeric block component is selectively removing relative to the polymeric matrix 52 comprising the first polymeric block component by an etch, which may be a reactive ion etch or a wet etch. The polymeric matrix 52 has a honeycomb pattern, and contains cylindrical holes having the first sublithographic diameter d1.

Figure 4A:
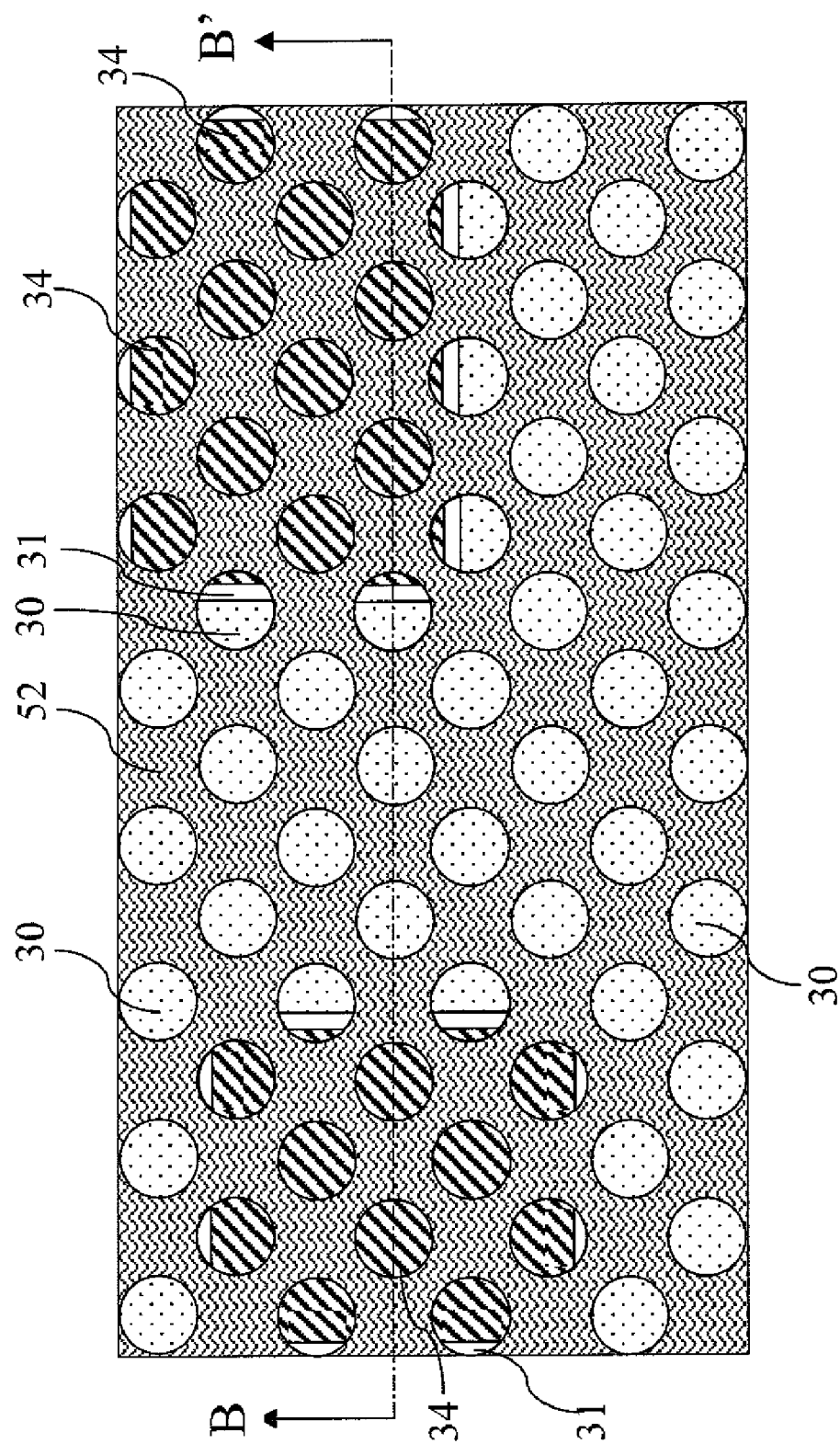
Figure 4B:
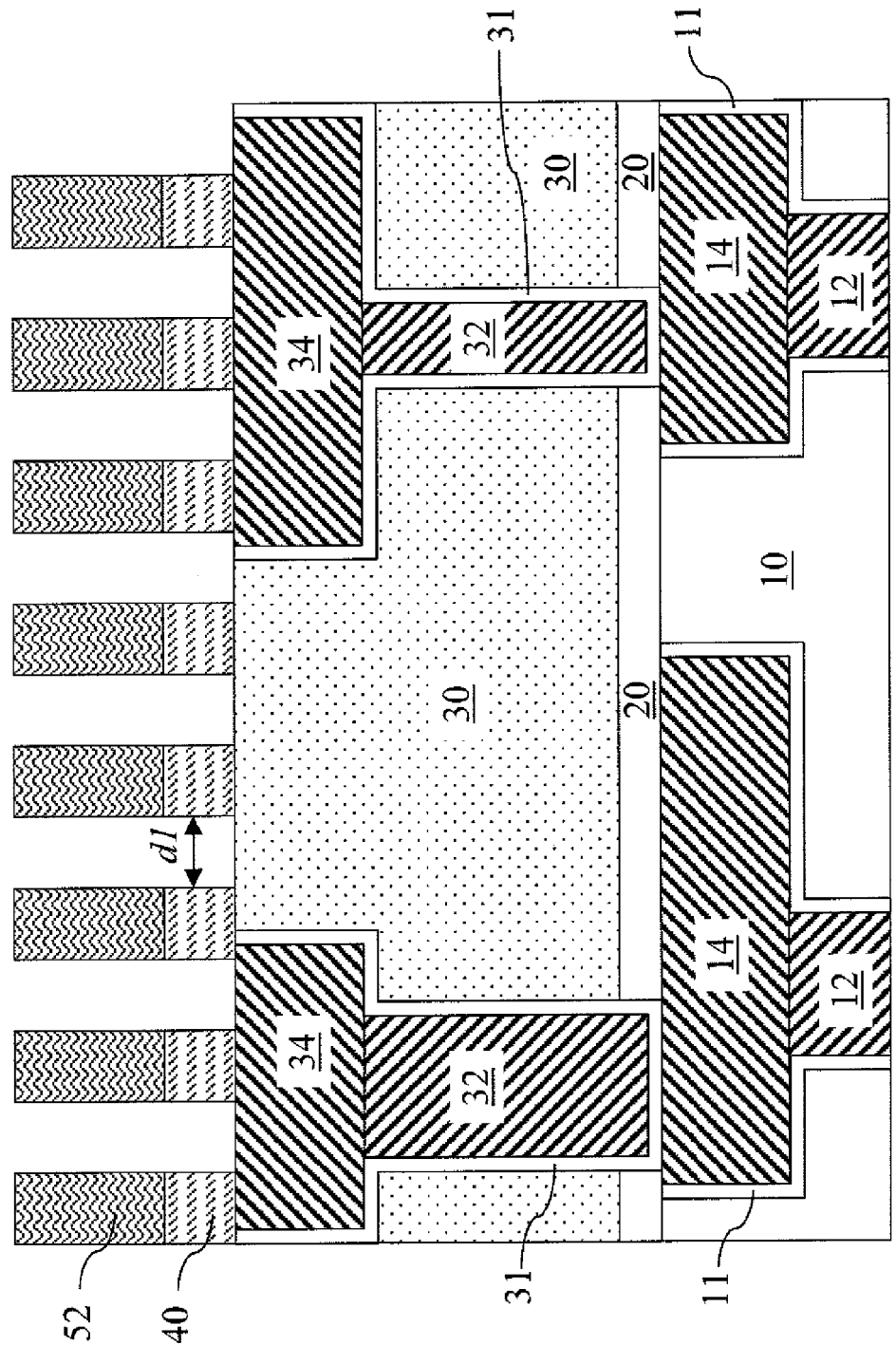

Referring to FIGS. 4A and 4B, the honeycomb pattern in the polymeric matrix 52 is then transferred into the hard mask layer 40 by an anisotropic reactive ion etch that employs the polymeric matrix 52 as an etch mask. A plurality of cylindrical holes having the sublithographic diameter d is formed in the hard mask layer 40. Preferably, the anisotropic reactive ion etch is selective to the at least one metal line 34 and the at least one metallic liner 31. The honeycomb pattern in the polymeric matrix 52 is transferred into the hard mask layer 40.

Portions of top surfaces of the at least one metal layer 34 and top surfaces of the at least one metallic liner 31 are exposed within some of the circular holes in the honeycomb pattern in the hard mask layer 40. Portions of top surfaces of the low-k material layer 30 are exposed within some others of the circular holes in the honeycomb pattern in the hard mask layer 40.

Figure 5A:
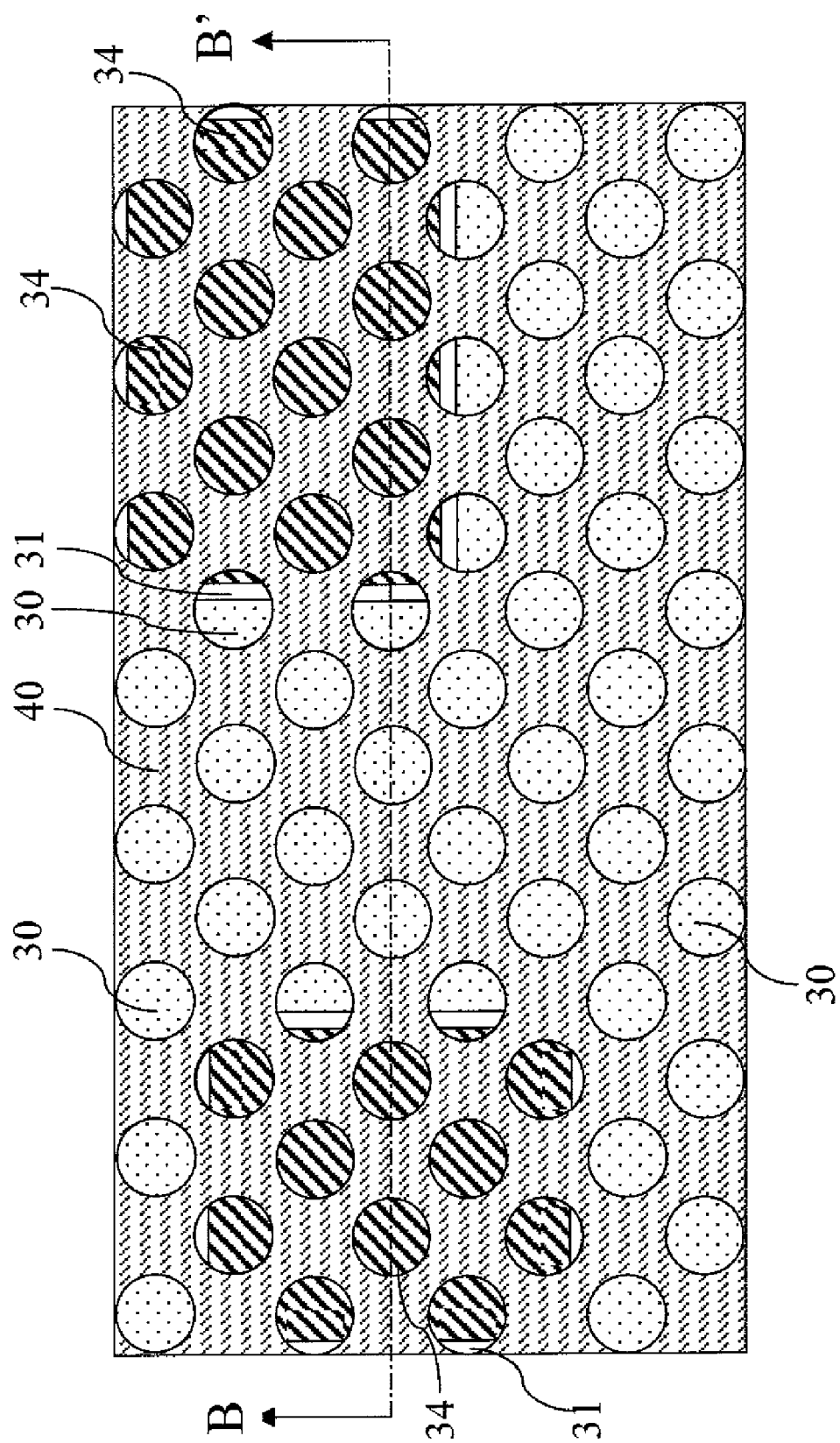
Figure 5B:
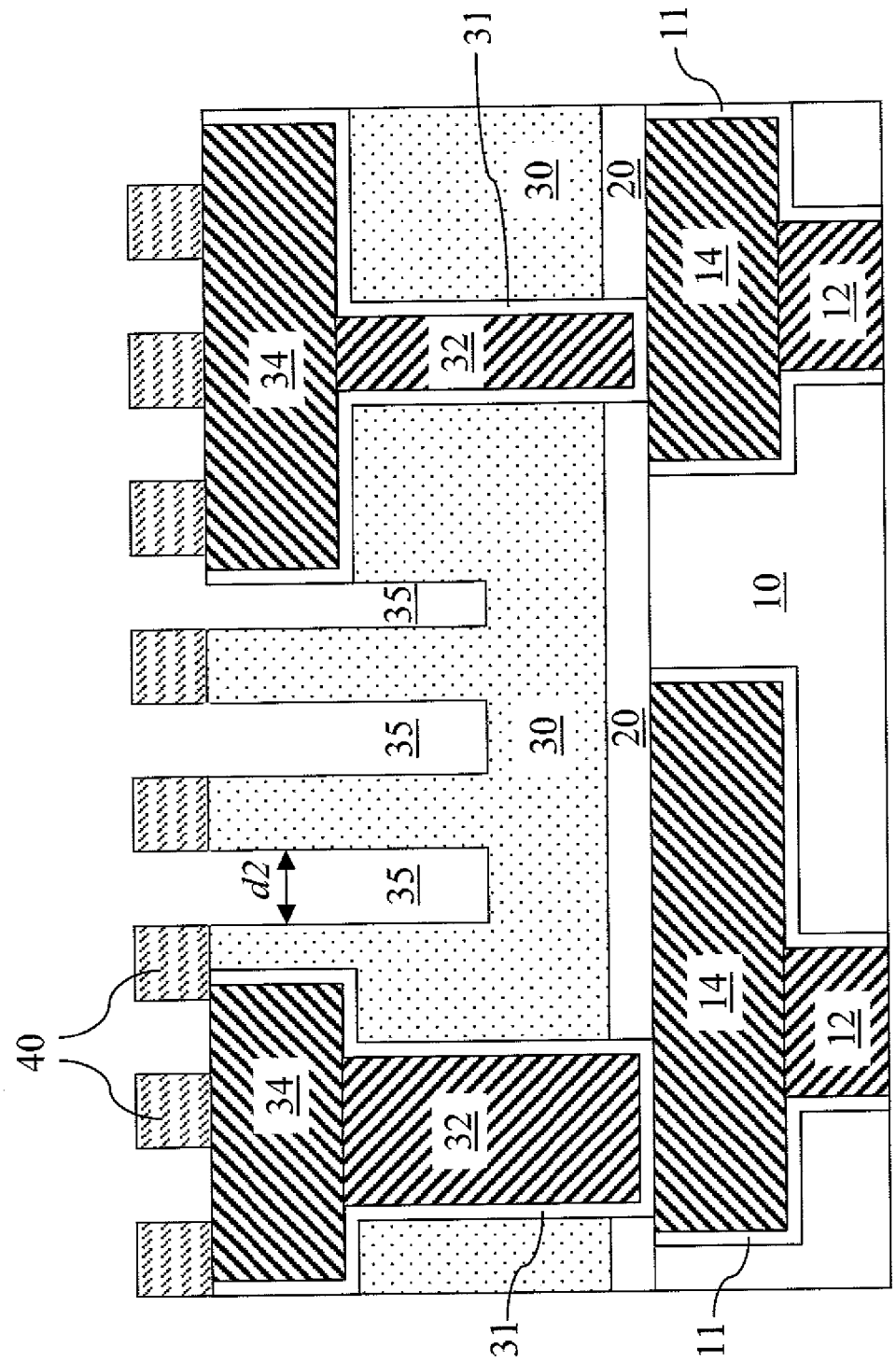

Referring to FIGS. 5A and 5B, the polymeric matrix 52 is optionally removed. An anisotropic etch is performed to etch the material of the low-k material layer selective to the at least one metal line 34 or the at least one metallic liner 31. In case the polymeric matrix 52 is removed prior to the anisotropic etch the hard mask layer 40, which at this point contains the honeycomb pattern, is employed as an etch mask. In case the polymeric matrix 52 is not removed prior to the anisotropic etch, the polymeric matrix 52 may be employed as an etch mask during the anisotropic etch. The anisotropic etch may be a reactive ion etch. The anisotropic etch is selective to the at least one metal line 34 or the at least one metallic liner 31, i.e., the anisotropic etch does not remove the at least one metal line 34 or the at least one metallic liner 31 in any substantial manner, while etching the low-k material layer 30.

A plurality of cavities 35 is formed in the low-k material layer 30. Each of the plurality of cylindrical cavities is separated from each other by the low-k material layer 30. A separation distance between an adjacent pair of cylindrical cavities may be a sublithographic dimension, which may be from about 5 nm to about 35 nm. Some of the plurality of cavities 35 are cylindrical cavities having a second sublithographic diameter d2, which may be substantially the same as, greater than, or less than, the first sublithographic diameter d1. The second sublithographic diameter d2 may be from about 5 nm to about 35 nm. Some others of the plurality of cavities 35 have a shape that is a portion of a circular cylinder and has a vertical planar surface, which abuts a surface of the at least one metallic liner 31. The depth of each of the plurality of cylindrical cavities 35 is less than the thickness of the low-k material layer 30 outside the plurality of cavities 35. Thus, the plurality of cylindrical cavities 35 does not contact the dielectric cap layer 20.

The polymeric matrix 52 is removed either prior to the anisotropic etch or after the anisotropic etch. Suitable surface cleaning may be performed at this point.

Figure 6A:
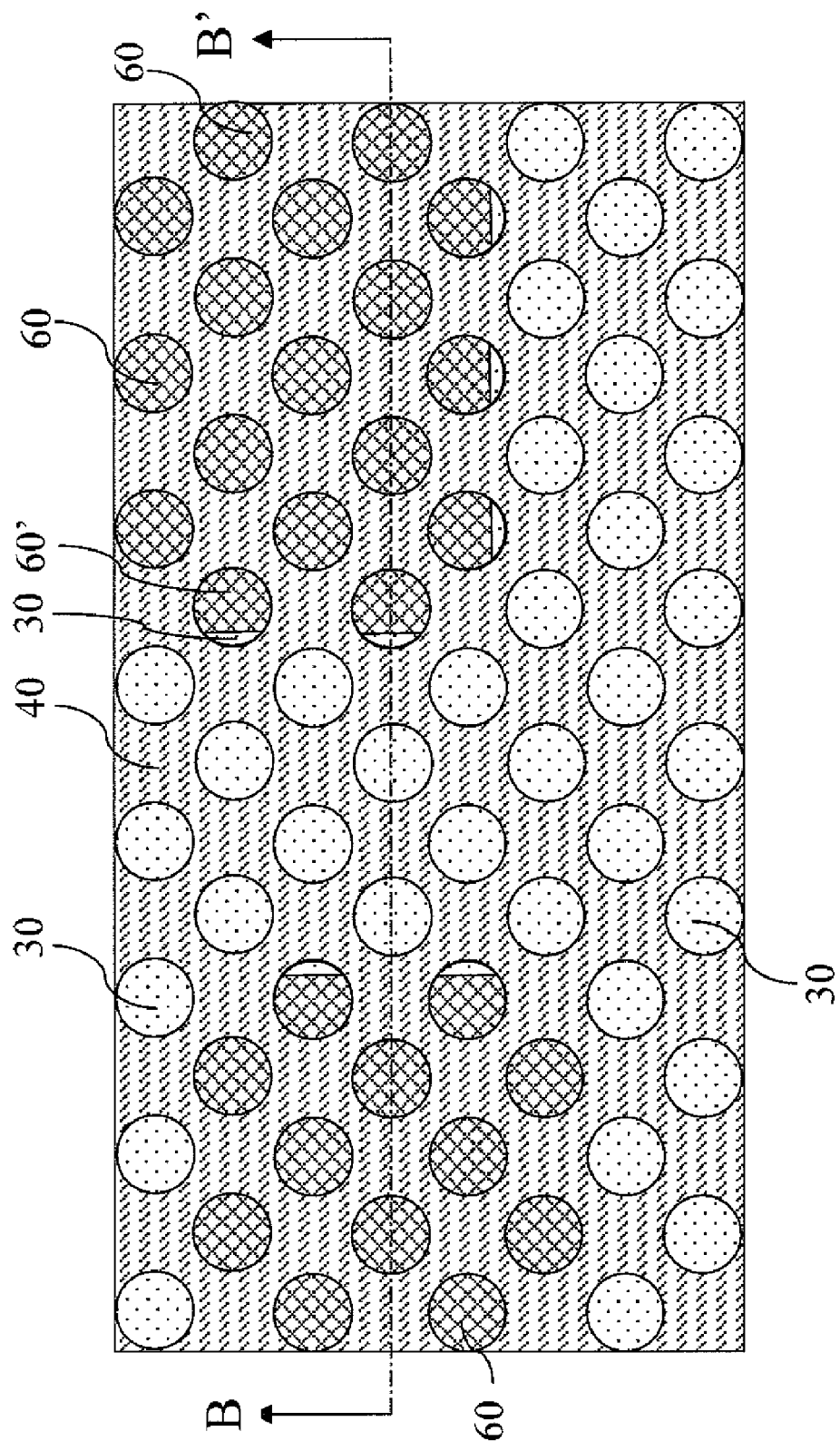
Figure 6B:
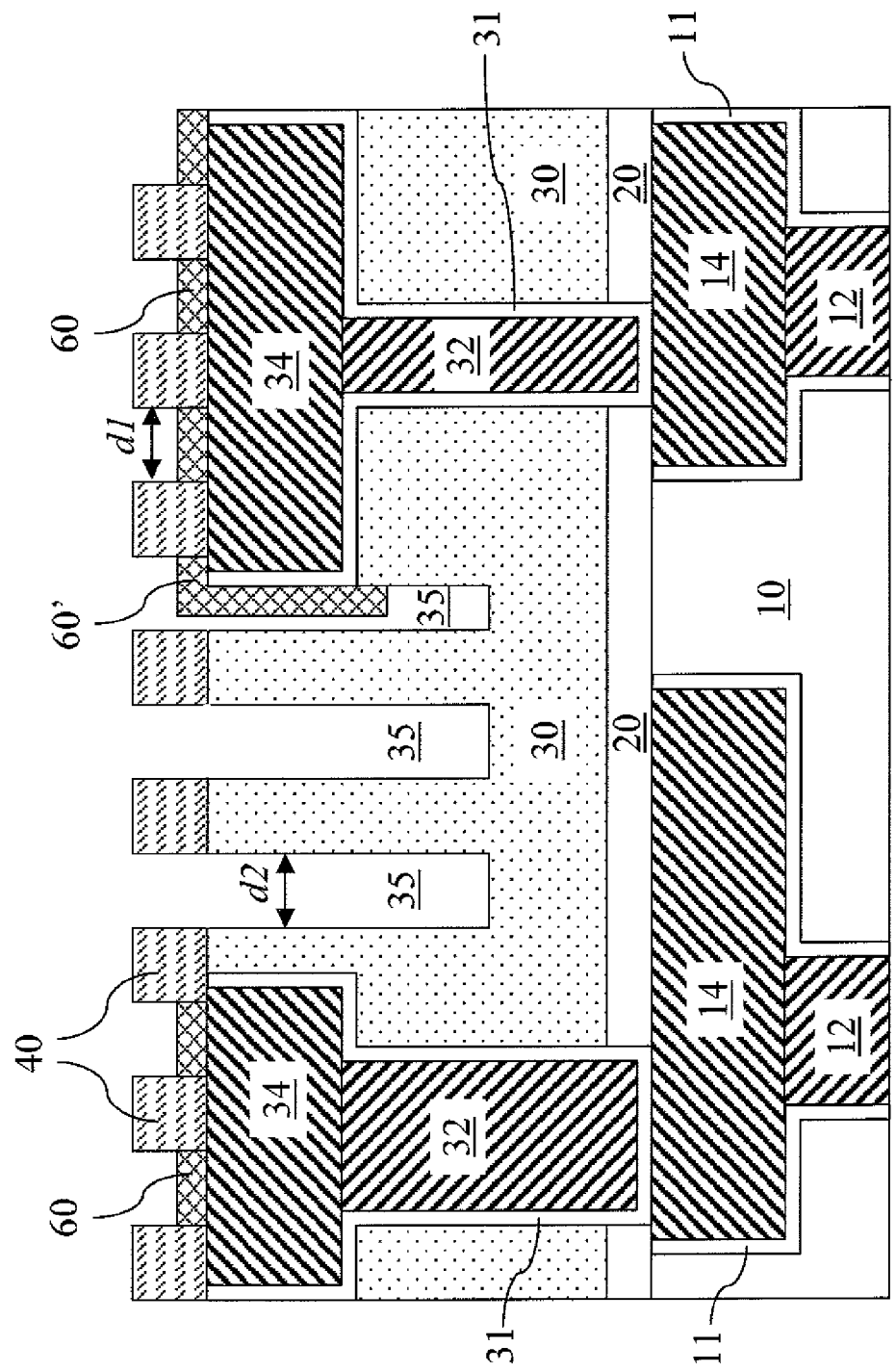
Figure 7A:
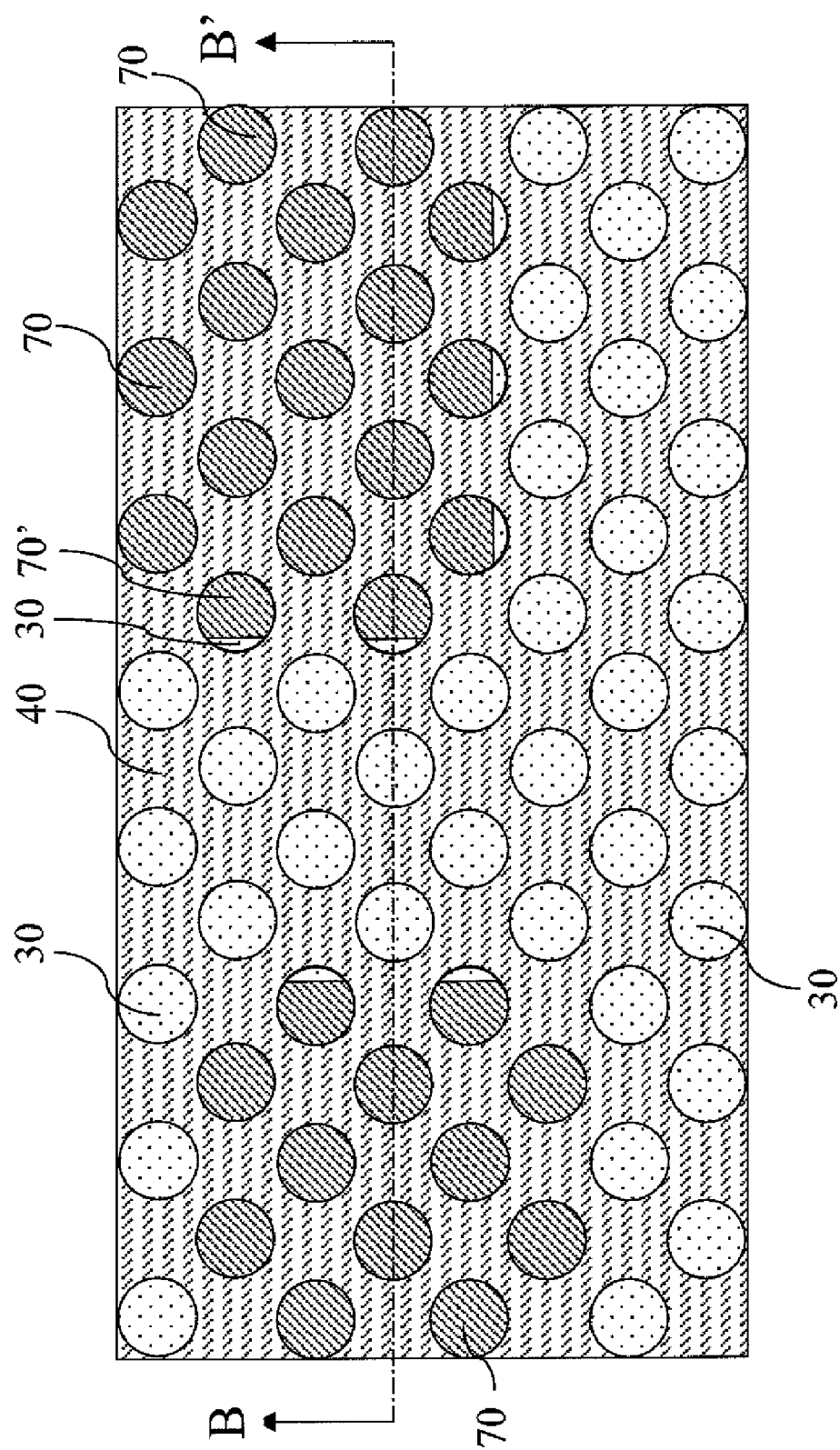
Figure 7B:
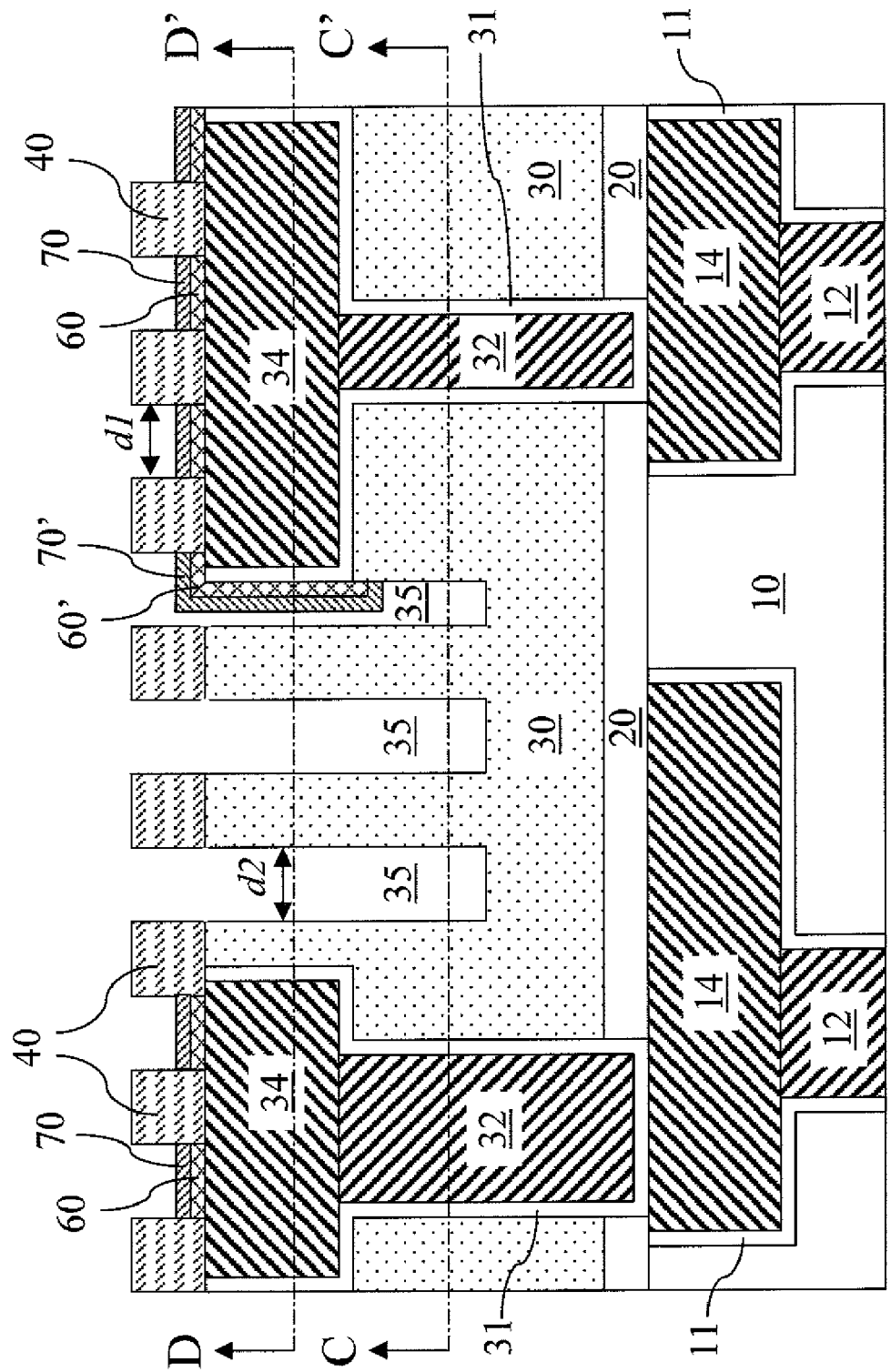
Figure 7C:
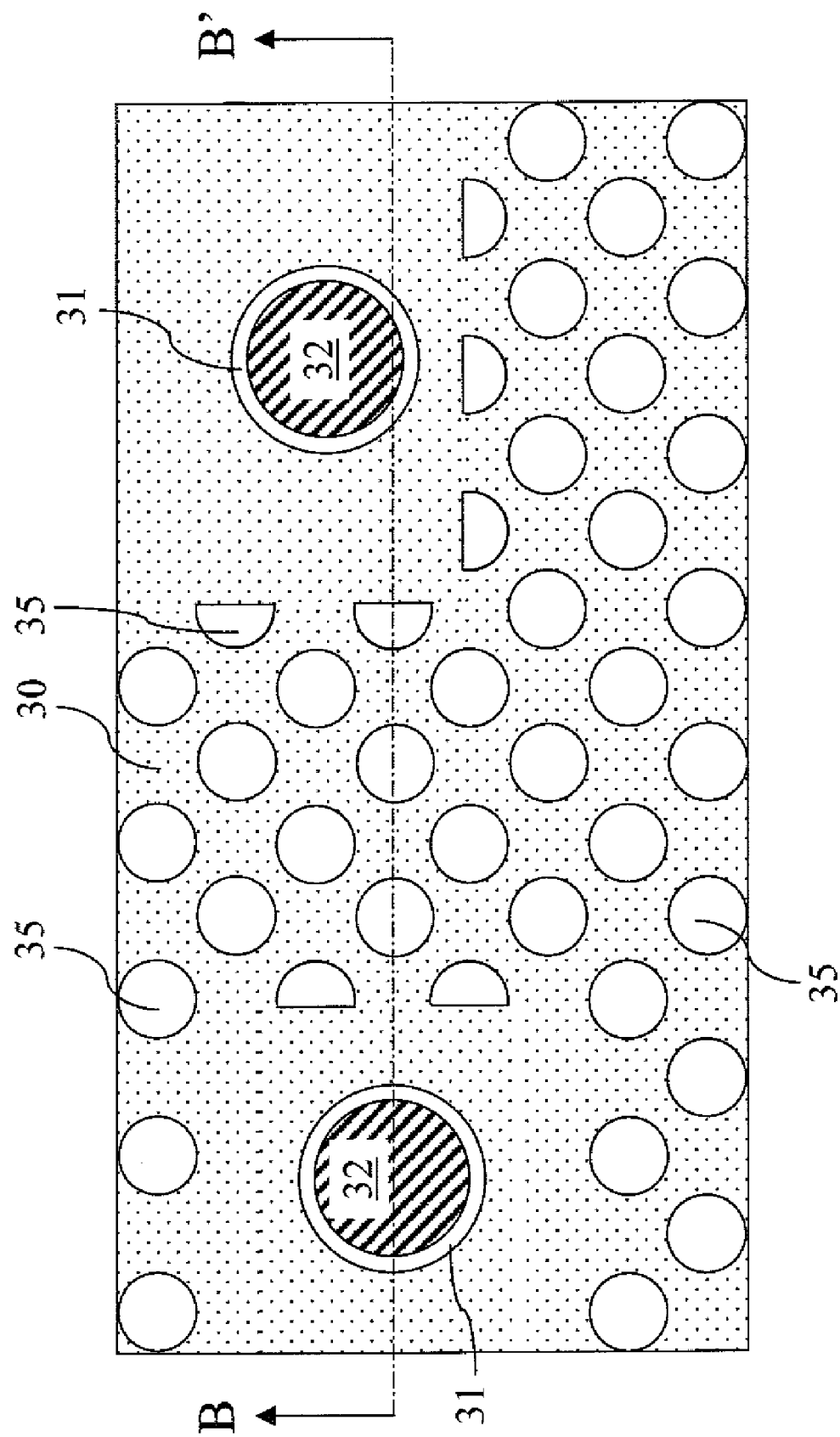
Figure 7D:
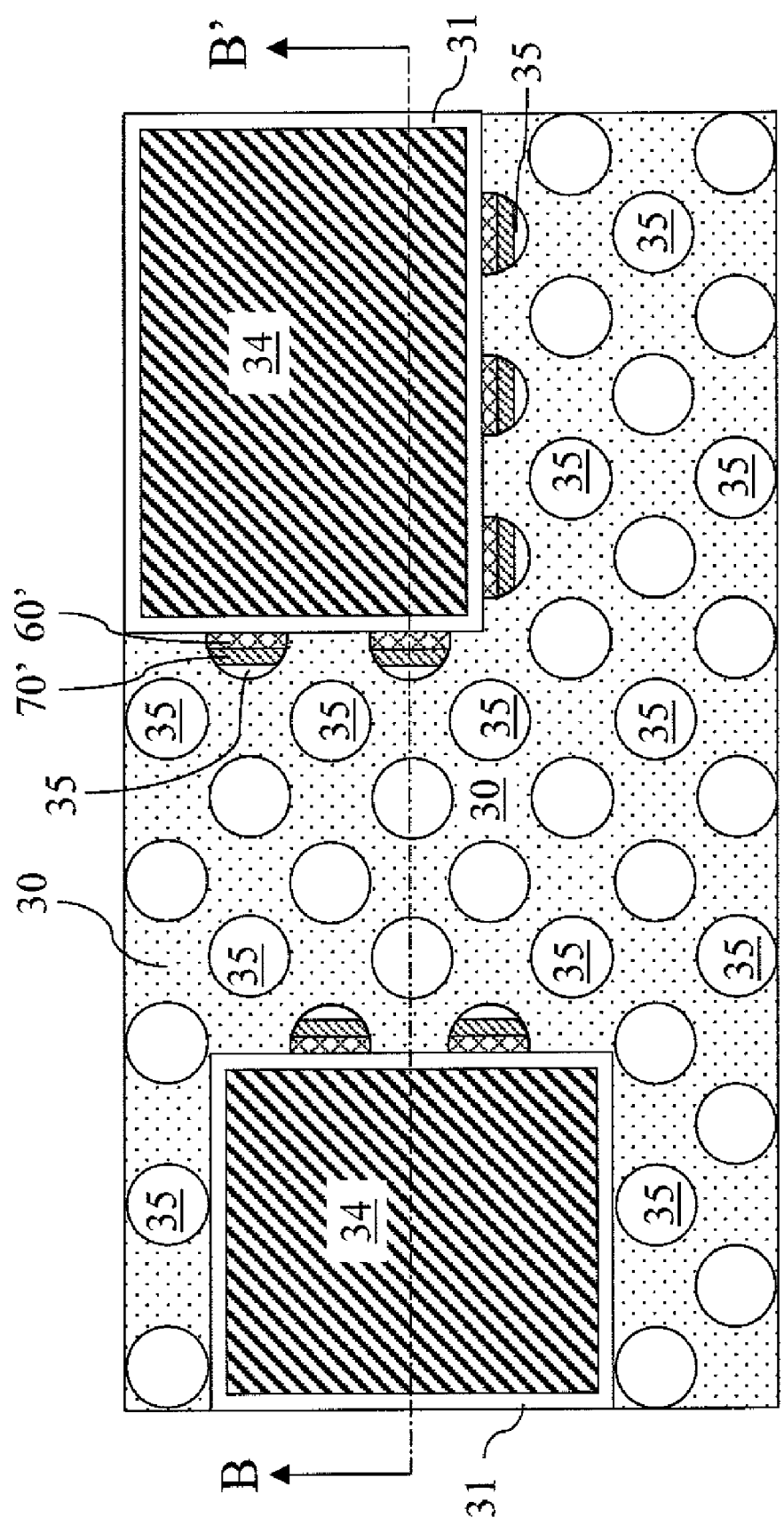

Referring to FIGS. 6A and 6B, a plurality of metal pads 60 are formed by plating on exposed portions of top surfaces of the at least one metal line 34. At least one metal portion 60' is concurrently formed on exposed portions of the at least one metallic liner 31 by plating. Electroplating or electroless plating may be employed. The plurality of metal pads 60 and the at least one metal portion 60' comprise a same metal, which is an elemental metal or a metallic alloy that is more cathodic in a Galvanic series than the conductive metal comprising the at least one metal line 34.

Preferably, the plurality of metal pads 60 and the at least one metal portion 60' are formed by electroless plating. Electroless plating begins by forming a surface that is clean and catalytic. The artisan will appreciate that numerous techniques exist for creating an autocatalytic surface with a variety of chemicals, though for brevity the discussion herein focuses on those chemicals most suited for electroless deposition on copper as most probe panels use copper as its plating surface.

The Galvanic series, or electropotential series, known in chemistry determines the nobility of metals and semi-metals. When two metals are submerged in an electrolyte, while electrically connected, the less noble metal will experience galvanic corrosion. The rate of corrosion is determined by the electrolyte and the difference in nobility. The difference can be measured as a difference in voltage potential. Galvanic reaction is the principle on which batteries are based.

The following is a Galvanic series for stagnant seawater, that is, water having low oxygen content, for a selection of elemental metal and metal compounds. The elements are listed in the order of decreasing nobleness, i.e., from the most noble element in the beginning to the least noble element at the end: Graphite, Palladium, Platinum, Gold, Silver, Titanium, Stainless steel (316 passive), Stainless Steel (304 passive), Silicon bronze, Stainless Steel (316 active), Monel 400, Phosphor bronze, Admiralty brass, Cupronickel, Molybdenum, Red brass, Brass plating, Yellow brass, Naval brass 464, Uranium with 8% Mo, Niobium with 1% Zr, Tungsten, Stainless Steel (304 active), Tantalum, Chromium, Nickel (passive), Copper, Nickel (active), Cast iron, Steel, Lead, Tin, Indium, Aluminum, Uranium (pure), Cadmium, Beryllium, Zinc, and Magnesium.

For description of the present invention, the order of decreasing nobleness in stagnant sea water as listed above is employed. It is noted, however, that the order may change in different environments and that the present invention may be practiced when relative electrochemical nobleness of elements are altered in a different environment, i.e., in a solution with a different composition.

Displacement deposits occur when a metal surface with a lower free energy, i.e., electrochemically less noble, is placed into a solution containing metal ions that are at a higher free energy, i.e., more noble. The difference in the thermodynamic free energies drives the reaction that replaces the metal atom on the surface with the metal atoms from the solution. The kinetics of the reaction is governed by the fractional surface coverage of the replacement atom on the surface. As the fractional coverage of the surface increases, the reaction slows down.

In case the at least one metal line 34 comprises copper, the elemental metal or the metallic alloy that is employed in the plating process is more cathodic than copper in the Galvanic series. Further, the elemental metal or the metallic alloy is capable of forming a metal silicide. Non-limiting exemplary materials for the elemental metal or the metallic alloy that is more cathodic than copper and capable of forming a metal silicide include: Pt, Ti, Ta, Ni, and CoWP.

In case CoWP is employed as the plated metal, the concentration of W is from about 4% to about 10%, and preferably from about 6% to about 8% in atomic concentration. The concentration of P is from about 1.5% to about 4.5%, and preferably from about 2.5% to about 3.5% in atomic concentration. In composition, Co comprise the rest of the plated metal.

Metal deposit is selectively performed on exposed metallic surfaces during the plating process. Since formation of a deposit in a plating process, whether in an electroplating process or in an electroless plating process, require conduction of current, formation of deposits is necessarily on conductive surfaces, which include exposed surfaces of the at least one metal line 34 and exposed surfaces of the at least one metallic liner 31. However, dielectric surfaces including the low-k material layer 30 and the hard mask layer 40 do not serve as deposit formation sites.

Since some of the holes, or openings, in the hard mask 40 have a circular shape, the plurality of metal pads 60 are cylindrical. Each of the plurality of metal pads 60 has a horizontal cross-sectional shape of a circle of the first sublithographic diameter d1. The thickness of each of the plurality of metal pads 60, which is the thickness of the metal deposit, may be less than, substantially equal to, or greater than the thickness of the hard mask layer 40. Preferably, the thickness of each of the plurality of metal pads 60 is less than the thickness of the hard mask layer 40, and may be from about 3 nm to about 40 nm. A lateral thickness of the at least one metal portion 60' formed directly on vertical sidewalls of the at least one metallic liner 31 may be substantially the same as the thickness of the plurality of metal pads 60 since electroplating or electroless plating may be performed such that the thickness of the deposit is independent of geometry.

Referring to FIGS. 7A-7D, exposed surfaces of the plurality of metal pads 60 and the at least one metal portion 60' are silicided by exposure to, and reaction with, a silicon containing gas. The silicidation of the metal of the plurality of metal pads 60 and the at least one metal portion 60' may be a thermal process, a plasma assisted process, or a combination of both.

In one embodiment, the plurality of metal pads 60 and the at least one metal portion 60' are exposed to a silicon containing gas at a temperature from about 200° C. to about 600° C., and preferably from about 200° C. to about 500° C., and more preferably from about 200° C. to about 450° C. Preferably, thermal damage to the low-k material layer 30 is minimized by limiting thermal cycling of the exemplary semiconductor structure during the silicidation of the metal of the plurality of metal pads 60 and the at least one metal portion 60'. The silicon containing gas is one of $SiH_4$, $SiH_2Cl_2$, $SiHCl_3$, $SiCl_4$, $Si_2H_6$, chlorinated derivatives of $Si_2H_6$, and a mixture thereof. A carrier gas such as $H_2$, $N_2$, He, Ar, or a combination thereof may be optionally employed. Partial pressure of the silicon containing gas may be from about 1 mTorr to about 100 Torr, although lesser and greater partial pressures are also explicitly contemplated herein.

In another embodiment, the plurality of metal pads 60 and the at least one metal portion 60' are exposed to a plasma that contains a silicon containing gas. The process temperature of a process chamber during the plasma exposure may be from about 25° C. to about 600° C., and preferably from about 25° C. to about 450° C., although lower and higher temperatures are also explicitly contemplated herein. Preferably, thermal damage to the low-k material layer 30 is minimized by limiting thermal cycling of the exemplary semiconductor structure during the silicidation of the metal of the plurality of metal pads 60 and the at least one metal portion 60'. The silicon containing gas is one of $SiH_4$, $SiH_2Cl_2$, $SiHCl_3$, $SiCl_4$, $Si_2H_6$, chlorinated derivatives of $Si_2H_6$, and a mixture thereof. A carrier gas such as $H_2$, $N_2$, He, Ar, or a combination thereof may be optionally employed. Partial pressure of the silicon containing gas may be from about 0.1 mTorr to about 100 mTorr, although lesser and greater partial pressures are also explicitly contemplated herein.

A test was performed on silicidation of CoWP by a silicon containing gas during the course of research leading to the present invention. The results of the test are summarized below. 20 nm thick CoWP layers were plated on three samples containing a metal line comprising copper. The first sample was not exposed to any silicon containing gas. The second sample was exposed to 480 sccm of $SiH_4$ gas for 5 seconds in a process chamber at a pressure of about 400 mTorr and at a temperature of about 450° C. The third sample was exposed to 480 sccm of $SiH_4$ gas for 30 seconds in the process chamber at a pressure of about 400 mTorr and at a temperature of about 450° C. Auger analysis of the three samples showed absence of any metal silicide on the first sample, presence of about 1.2 nm of metal silicide on the second sample, and presence of about 1.5 nm of metal silicide on the third sample. The metal silicide comprised at least cobalt and silicon.

The silicidation of exposed surfaces of the plurality of metal pads 60 converts a surface region of each of the plurality of metal pads 60 into one of a plurality of metal silicide pads 70. Concurrently with formation of the plurality of metal pads 60, at least one metal silicide portion 70' is formed on exposed surfaces of the at least one metal portion 60'. The plurality of metal silicide pads 70 and the at least one metal silicide portion 70' may have substantially the same thickness, which may be from about 1 nm to about 5 nm, although lesser and greater thicknesses are also explicitly contemplated herein. In general, higher partial pressure, higher temperature, and/or longer exposure time to a silicon containing gas increases the thickness of the plurality of metal silicide pads 70 and the at least one metal silicide portion 70'.

Each of the plurality of metal pads 60 vertically abuts the at least one metal line 34 and one of the plurality of the metal silicide pads 70. Since each of the plurality of metal silicide pads 70 is derived from a consumed portion of one of the plurality of metal pads 60, the plurality of metal pads 70 and the plurality of metal silicide pads comprise the same metal. For example, in case the plurality of metal pads 60 is platinum, the plurality of metal silicide pads 70 is platinum silicide. Hence, the plurality of metal pads 60 and the plurality of metal silicide pads 70 comprise the same metal, which is platinum. In addition, the plurality of metal silicide pads 70 also comprise silicon. In case the plurality of metal pads 60 is CoWP, the plurality of metal silicide pads 70 contains cobalt silicide. Hence, the plurality of metal pads 60 and the plurality of metal silicide pads 70 comprise the same metal, which is cobalt.

A vertically abutting pair of one of the plurality of metal pads 60 and one of the plurality of metal silicide pads 70 is herein referred to as a conductive material stack. The conductive material stack has a substantially constant cross-sectional area between a top surface of the conductive material stack and a bottom surface of the conductive material stack. The cross-sectional area has a shape of a circle having the first sublithographic diameter d1.

Each of the at least one metal silicide portion 70' laterally abuts one of the at least one metal portion 60' and comprises the same material as the plurality of metal silicide pads 70.

Figure 8A:
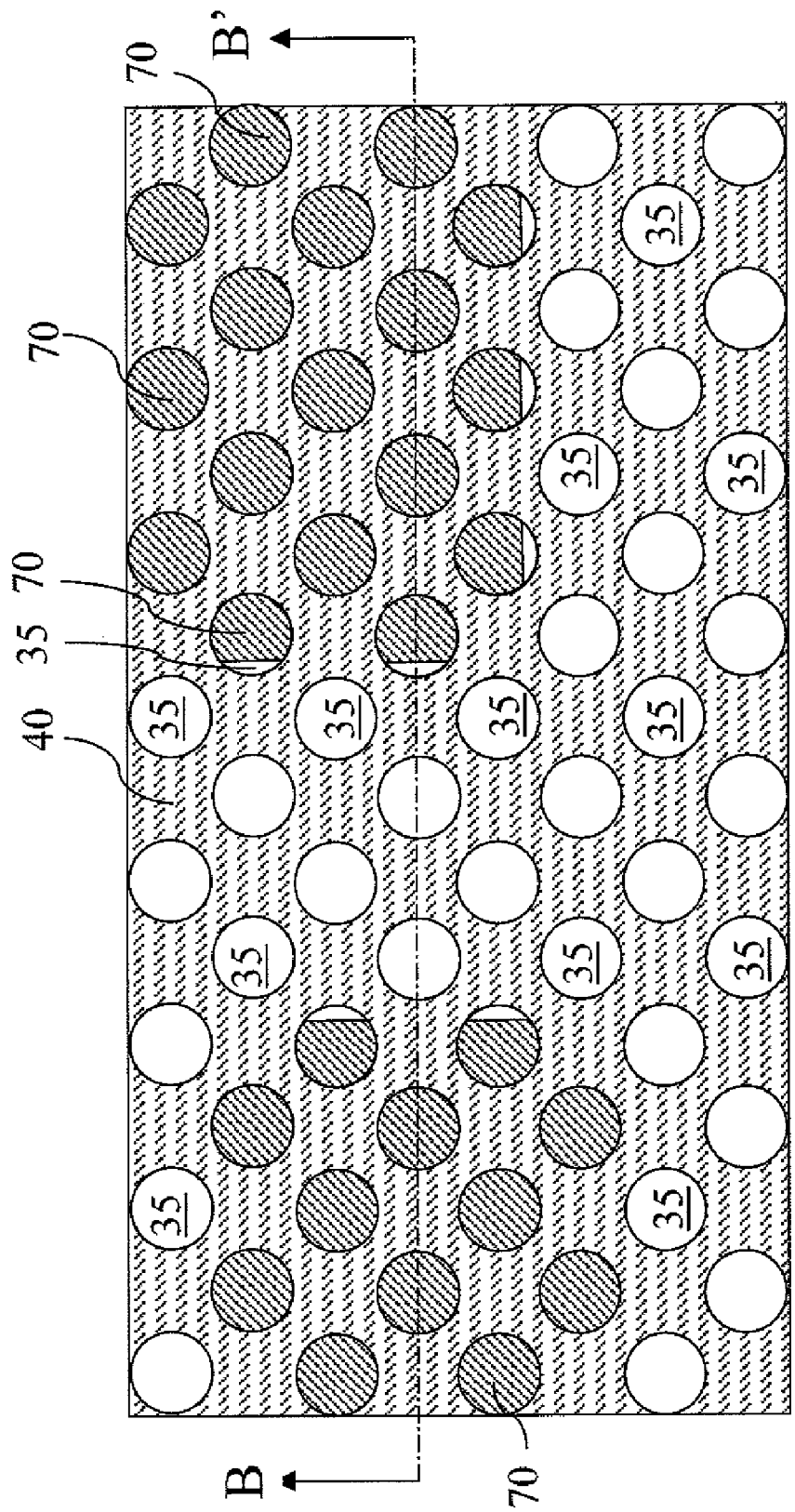
Figure 8B:
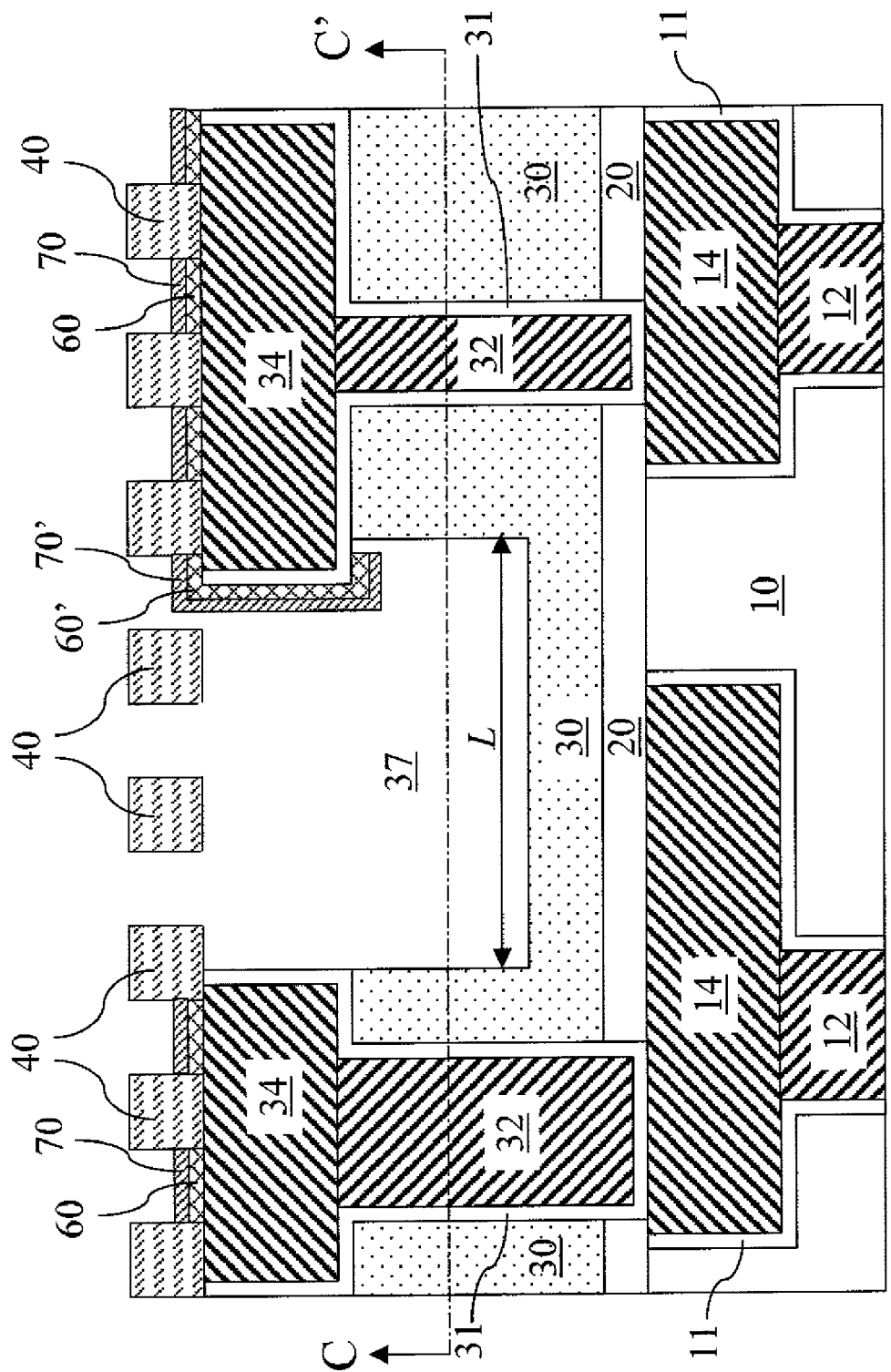
Figure 8C:
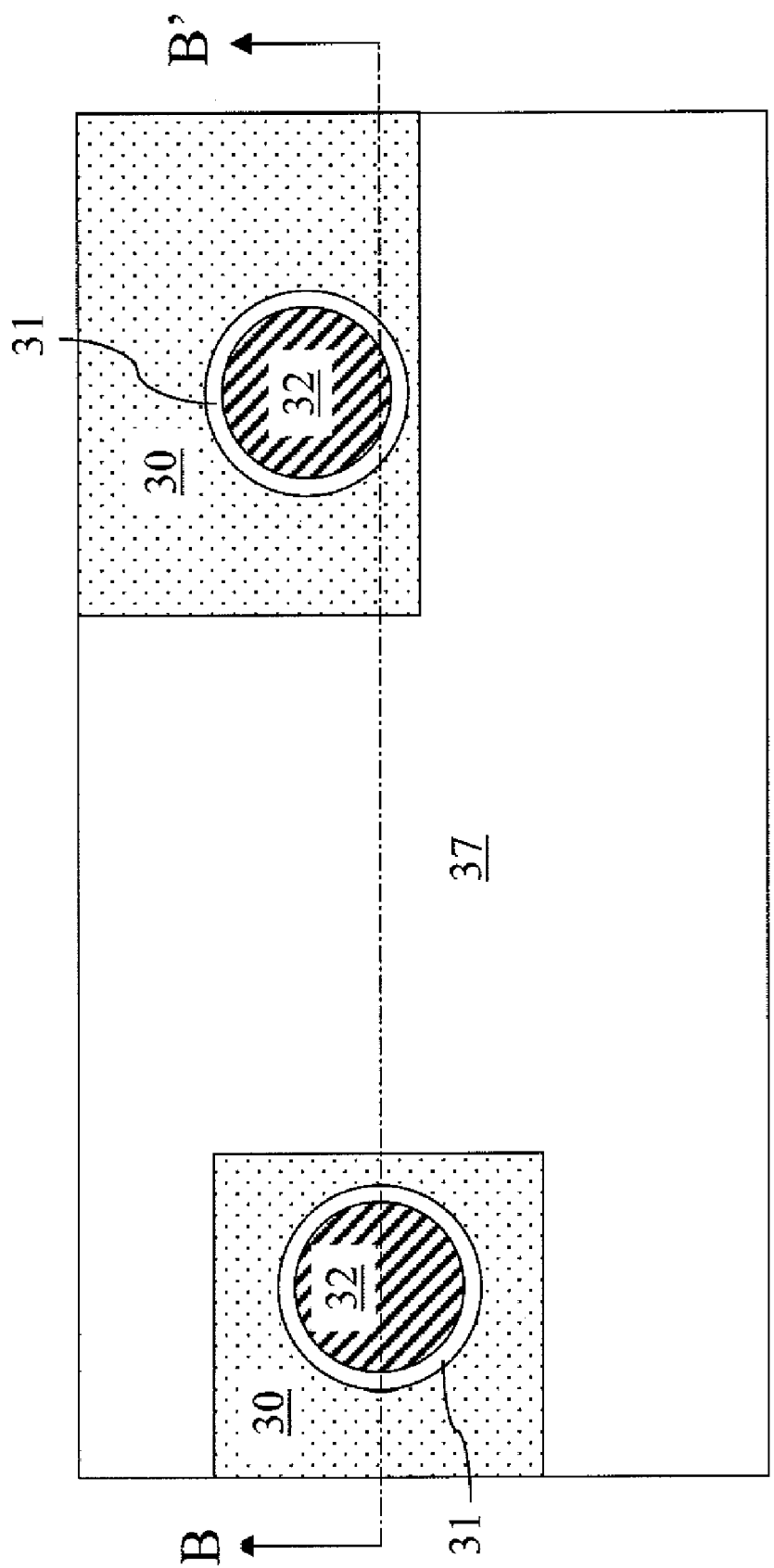

Referring to FIGS. 8A-8C, an isotropic etch is performed to laterally etch the sidewalls of the plurality of cavities 35. The isotropic etch may be an isotropic dry etch, an isotropic chemical downstream etch, or a wet etch. The isotropic etch is selective to the hard mask layer 40, the plurality of metal silicide pads 70, and the at least one metal silicide portion 70'. Preferably, the isotropic etch is also selective to the at least one metallic liner 31. The isotropic etch removes the portion of the low-k material layer 30 between adjacent pairs of the plurality of cavities 35.

Preferably, the isotropic etch is a wet etch employing a dilute hydrofluoric acid (DHF) solution. The dilute hydrofluoric acid etches the low-k material layer 30 selective to the metallic liner 31. Further, the dilute hydrofluoric acid is selective to metal silicides such as the plurality of metal silicide pads 70 and the at least one metal silicide portion 70'. Thus, surfaces of the at least one metal line 34 are protected from the dilute hydrofluoric acid. Not necessarily but preferably, the dilute hydrofluoric acid is also selective to the hard mask layer 40. The dilute hydrofluoric acid is selective to silicon carbide nitride (SiCN), which the hard mask layer 40 may be comprised of.

But for the presence of the plurality of the metal silicide pads 70 and the at least one metal silicide portion 70', the dilute hydrofluoric acid would etch the plurality of metal pads 60 and the at least one metal portion 60' and subsequently etch the at least one metal line 34, resulting in degradation of electromigration resistance. The presence of the plurality of the metal silicide pads 70 and the at least one metal silicide portion 70' according to the present invention prevents etching of the metal pad 60 or the at least one metal portion 60', resulting in no degradation of electromigration resistance in the interconnect structure.

As the portions of the low-k material layer 30 is removed between adjacent pairs of the plurality of cavities are removed, a merged cavity 37 having a lithographic lateral dimension L is formed in the low-k material layer 30. For example, the lithographic lateral dimension L may be greater than a separation distance between one of the at least one metal line 34 and another of the at least one metal line 34. Since each of the at least one metal line 34 is formed by lithographic means, the distance between the pair of the at least one metal line 34 is necessarily a lithographic distance. Thus, the merged cavity 37 is contiguous between the pair of the at least one metal line 34, and the lithographic lateral dimension L may exceed the distance between the pair of the at least one metal line 34, which is a lithographic dimension.

The at least one metallic liner 31 may directly contact the merged cavity 37. The portion of the at least one metallic liner 32 laterally abutting at least one metal via 32 may be completely surrounded by the low-k material layer 30. Alternately, the portion of the at least one metallic liner 32 laterally abutting at least one metal via 32 may directly contact the merged cavity 37.

Figure 9A:
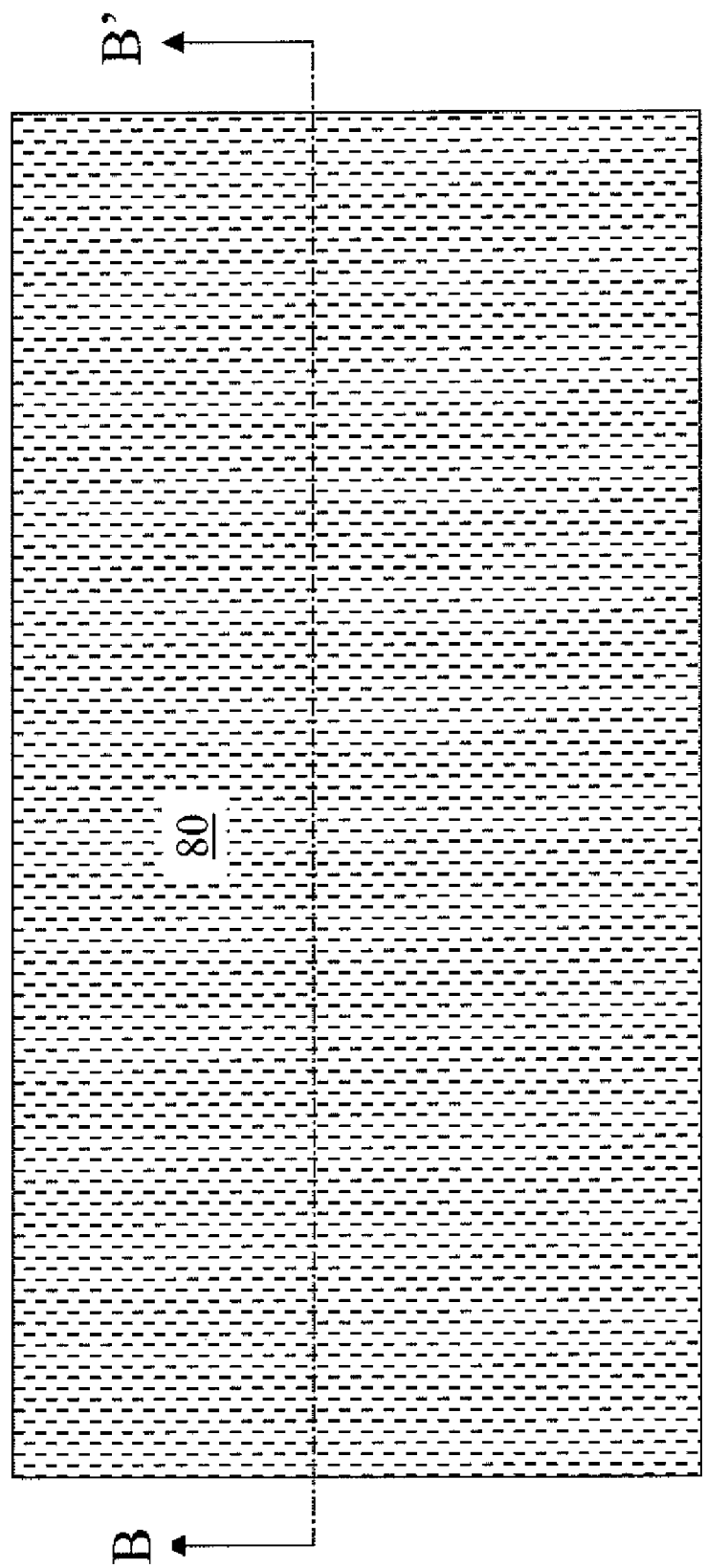
Figure 9B:
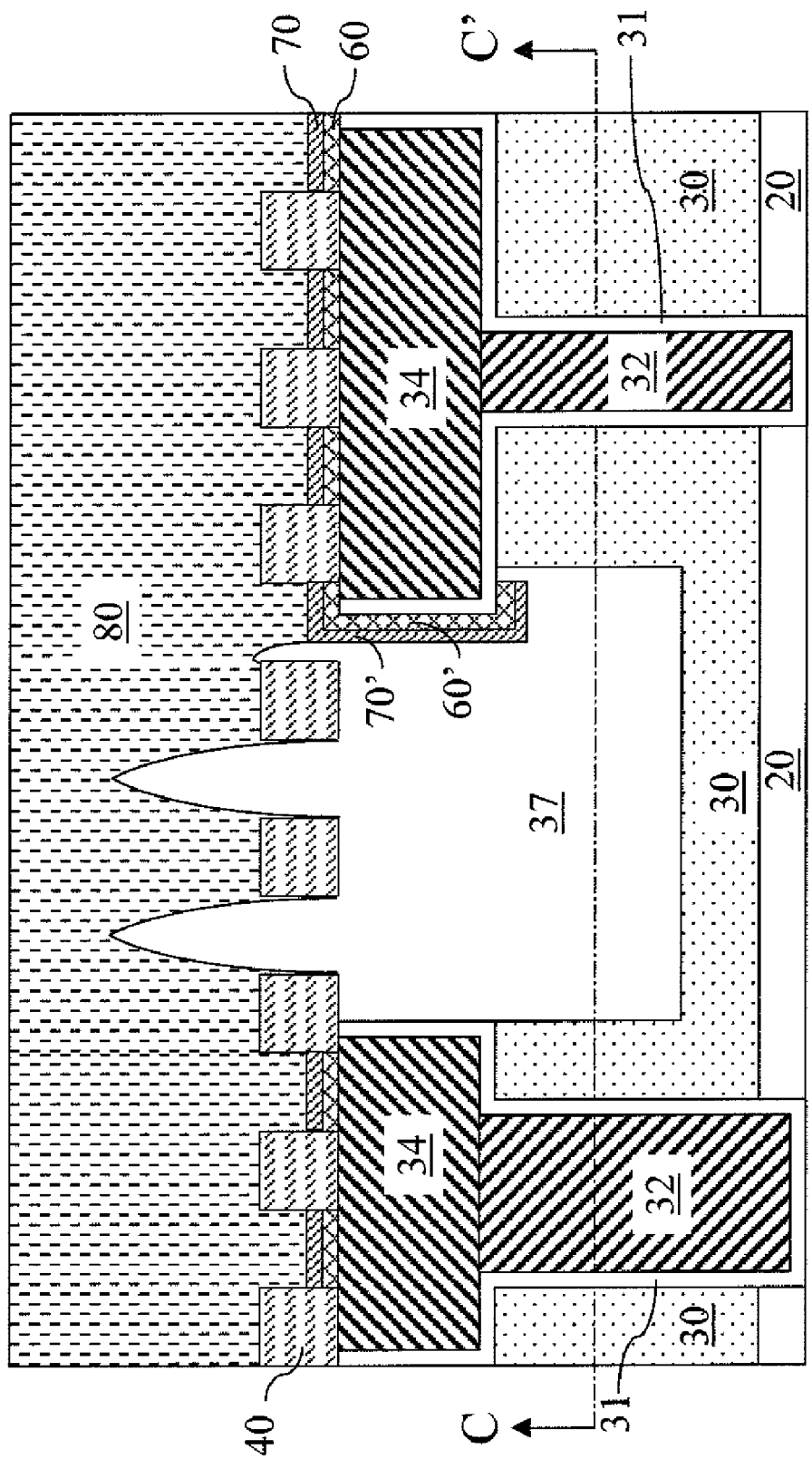

Referring to FIGS. 9A and 9B, an overlying dielectric material layer 80 is formed, which comprises a low-k material such as an organosilicate glass or a silicon oxide dielectric material. Preferably, the overlying dielectric material layer 80 comprises an organosilicate glass. Preferably, a deposition having a low step coverage is employed, i.e., a non-conformal deposition process in which depletion of reactants is high is employed, so that a minimal amount of material (not shown) is deposited within the merged cavity. The holes in the hard mask layer 40 is sealed without filling the merged cavity with the dielectric material of the overlying dielectric material layer due to the low step coverage.

Thus, the merged cavity 37 is encapsulated by the low-k material layer 30, the metallic liner 31, the at least one metal silicide portion 70', the hard mask layer 40, and the overlying dielectric material layer 80.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming an interconnect structure comprising:
    forming a metal feature within a low dielectric constant (low-k) material layer having a dielectric constant less than 2.8;
    forming a hard mask layer comprising a dielectric material on said metal feature and said low-k material layer;
    forming a plurality of holes in said hard mask layer to expose portions of said metal feature and portions of said low-k material layer;
    selectively forming a plurality of conductive material stacks directly on said metal feature, while not forming a conductive material stack on said low-k material layer; and
    forming a cavity having a lithographic lateral dimension in said low-k material layer by an etch, while said plurality of conductive material stacks protects said metal feature from said etch.

2. The method of claim 1, wherein said metal feature and said low-k material layer have substantially coplanar top surfaces, and wherein said hard mask layer abuts said substantially coplanar top surfaces.

3. The method of claim 1, wherein said cavity includes at least two holes of said plurality of holes.

4. The method of claim 1, wherein each of said plurality of conductive material stacks comprises a metal pad and a metal silicide pad, wherein said metal pad vertically abuts said metal feature and said metal silicide pad.

5. The method of claim 4, further comprising plating an elemental metal or a metallic alloy on said metal feature to form a plurality of said metal pads.

6. The method of claim 4, further comprising forming a metallic liner in a line trench in said low-k material layer prior to forming said metal feature, wherein said metallic liner abuts said low-k material layer prior to formation of said cavity, and wherein said metallic liner abuts said cavity after formation of said cavity.

7. The method of claim 6, further comprising:
    forming at least one metal portion laterally abutting said metallic liner and comprising the same material as a plurality of said metal pad; and
    forming at least one metal silicide portion laterally abutting one of said at least one metal portion and comprising the same material as a plurality of said metal silicide pad, wherein said cavity directly contacts said at least one metal silicide portion.

8. The method of claim 6, further comprising:
    forming a via hole in said low-k material layer; and
    forming said metallic liner in said via hole, wherein said via hole is located directly beneath said line trench.

9. The method of claim 1, further comprising:
    forming a polymeric matrix comprising a first polymeric block component and containing cylindrical holes having a sublithographic diameter on said hard mask layer; and
    forming a plurality of cylindrical holes having said sublithographic diameter in said hard mask layer by etching said hard mask layer.

10. The method of claim 1, wherein said low-k dielectric material layer comprises at least one of an organosilicate glass (OSG) and a spin-on low-k dielectric material, wherein said OSG contains a matrix of a hydrogenated oxidized silicon carbon material (SiCOH) comprising atoms of Si, C, O and H in a covalently bonded tri-dimensional network, and wherein said spin-on low-k dielectric material comprises a thermosetting polyarylene ether.

* * * * *